United States Patent
Price et al.

(10) Patent No.: US 10,958,167 B2
(45) Date of Patent: Mar. 23, 2021

(54) CURRENT SENSING IN AN ON-DIE DIRECT CURRENT-DIRECT CURRENT (DC-DC) CONVERTER FOR MEASURING DELIVERED POWER

(71) Applicant: QUALCOMM Incorporated, San Diego, CA (US)

(72) Inventors: Burt Lee Price, Apex, NC (US); Wenjun Yun, Cary, NC (US)

(73) Assignee: Qualcomm Incorporated, San Diego, CA (US)

(*) Notice: Subject to any disclaimer, the term of this patent is extended or adjusted under 35 U.S.C. 154(b) by 353 days.

(21) Appl. No.: 16/058,167

(22) Filed: Aug. 8, 2018

(65) Prior Publication Data

US 2020/0052586 A1   Feb. 13, 2020

(51) Int. Cl.
*G06Q 20/06* (2012.01)
*H02J 13/00* (2006.01)
*H02M 3/155* (2006.01)
*G01R 19/25* (2006.01)
*H02M 1/088* (2006.01)
*H03F 3/45* (2006.01)
(Continued)

(52) U.S. Cl.
CPC ........ *H02M 3/155* (2013.01); *G01R 19/2513* (2013.01); *H02M 1/088* (2013.01); *H03F 3/45475* (2013.01); *H03K 5/24* (2013.01); *H03F 2203/45116* (2013.01); *H03K 17/687* (2013.01); *H03K 2217/0063* (2013.01); *H03K 2217/0072* (2013.01)

(58) Field of Classification Search
CPC ........ G06Q 20/065; H02J 13/00; G01R 1/00; G01R 31/28; G06F 11/2205; G06F 11/2273; G06F 1/26
See application file for complete search history.

(56) References Cited

U.S. PATENT DOCUMENTS 7,960,997 B2   6/2011  Williams
8,493,077 B2   7/2013  Ivanov et al.
9,494,957 B2   11/2016 Price et al.
(Continued)

OTHER PUBLICATIONS

International Search Report and Written Opinion for PCT/US2019/041273, dated Oct. 17, 2019, 19 pages.

*Primary Examiner* — Alvaro E Fortich
*Assistant Examiner* — Zannatul Ferdous
(74) *Attorney, Agent, or Firm* — Qualcomm Incorporated

(57) ABSTRACT

Current sensing in an on-die direct current-direct current (DC-DC) converter for measuring delivered power is disclosed. A DC-DC converter converts input voltage to output current at an output voltage coupled to a load circuit. The DC-DC converter includes a high side driver (HSD) circuit to drive the output current in a first stage, and a low side driver (LSD) circuit to couple the power output to a negative supply rail (GND) in a second phase, output current being periodic. The DC-DC converter includes an amplifier circuit to equalize an output voltage and a mirror voltage. Based on the mirror voltage, the current sensing circuit generates mirror current that corresponds to driver current. The mirror current can be measured as a representation of the output current delivered to the load circuit. A plurality of the DC-DC converters can provide multi-phased current to the load circuit for providing power to the load circuit.

27 Claims, 14 Drawing Sheets

(51) Int. Cl.
*H03K 5/24* (2006.01)
*H03K 17/687* (2006.01)

(56) References Cited

U.S. PATENT DOCUMENTS

| | | |
|---|---|---|
| 2002/0158615 A1 | 10/2002 | Goodfellow et al. |
| 2006/0125568 A1 | 6/2006 | Felder et al. |
| 2012/0306541 A1* | 12/2012 | Yang .................. G01R 19/0092 327/103 |
| 2014/0292298 A1 | 10/2014 | Pradhan |
| 2014/0347078 A1* | 11/2014 | Qin .................... G01R 19/0092 324/713 |
| 2016/0266175 A1 | 9/2016 | Nizza et al. |
| 2017/0126026 A1 | 5/2017 | Gerna et al. |

\* cited by examiner

CURRENT SENSING IN AN ON-DIE DIRECT CURRENT-DIRECT CURRENT (DC-DC) CONVERTER FOR MEASURING DELIVERED POWER

BACKGROUND

I. Field of the Disclosure

The technology of the disclosure relates generally to power distribution circuits in integrated circuits (ICs), such as an on-die direct current-direct current (DC-DC) converter and, more particularly, to measuring power distributed by a DC-DC converter(s) in a power distribution circuit.

II. Background

An integrated circuit (IC) in a chip includes a set of electronic circuits coupled to operating power from a power supply. A direct current (DC) voltage supply, such as a battery, is commonly used as a power supply for the operating power in an IC. For example, batteries are commonly used as the power source for ICs in portable devices, such as mobile phones. However, an IC may be designed to operate using power supplied at a different DC voltage level than a DC voltage level supplied by the power supply. For example, an IC containing a microprocessor requires power at a higher or lower voltage level than a voltage level supplied by the power supply. The need to decrease voltage to conserve power has also increased as demand for portable electronic devices that operate on battery power has increased. Further, because of an increased number of transistors included in an IC, there has been a trend to lower operating voltage to offset an increase in total current drawn from a power supply. Also, a higher switching speed of the increased number of transistors produces faster and larger current transients in a power distribution circuit. Additionally, an increase in a number of circuits in an IC has increased an amount of heat generated in the IC, which can lower performance Thus, the operating voltage of an IC has also been designed to be lowered to decrease heat.

For these reasons, it has become conventional to employ one or more on-die direct current-direct current (DC-DC) converters in a power distribution circuit in an IC to convert a voltage level of power from a power supply to a higher or lower DC voltage level. For example, a buck DC-DC converter (or step-down converter) may be employed in a power distribution circuit in an IC to step-down voltage. Multiple DC-DC converters may be included in a power distribution circuit to distribute power to circuits in different areas of the IC. The power distribution circuit may also need to be capable of adjusting the operating voltage in the IC for various reasons. For example, it may be desired to scale down or collapse power in an IC during idle modes of operation to conserve power, and then scale up power during active modes of operation. Also, it may be desired to boost power in an IC during hyper-performance modes to increase performance. Thus, it has also become common to include switching DC-DC converters to control power levels. A switching DC-DC converter, such as a buck DC-DC converter, operates periodically with each period having a charging stage and a discharging stage. On-chip pulse width modulation (PWM) is a technique to control a duty cycle of the charging stage and the discharging stage to provide switching control of DC-DC converters.

IC designs may require that power supplied in a power distribution circuit be accurately monitored to measure a total current distributed in the IC. For example, the temperature of an IC may be determined or estimated based on current measurement within the IC. By measuring the individual currents in on-die power sources, total current distributed by such on-die power sources can be determined, making it possible to manage the total power demand in the IC design. In addition, the individual currents may be compared to each other or to a current threshold for the DC-DC converter, making it possible to improve power distribution and avoid exceeding power limits, such as to prevent overheating.

SUMMARY OF THE DISCLOSURE

Aspects disclosed in the detailed description include current sensing in an on-die direct current-direct current (DC-DC) converter for measuring delivered power. For example, one or more DC-DC converters can be included in a power distribution circuit for converting an input power supplied at an input voltage to an output power at a desired output voltage. The output power can be supplied to a load circuit to supply power to the load circuit. In one example, a plurality of DC-DC converters can be provided in the power distribution circuit to provide multi-phase driver currents. In one example, the DC-DC converter includes a high side driver (HSD) circuit configured to charge an inductor coupled between a driver output node of the HSD circuit and a load circuit node in a charging stage of operation of the DC-DC converter in response to a modulated signal. In this example, the DC-DC converter also includes a low side driver (LSD) circuit configured to couple the driver output node to a negative supply rail or ground (GND) to discharge the inductor in a discharging stage of operation of the DC-DC converter. To measure the delivered power, the DC-DC converter also includes a current sensing circuit to sense a driver current in the HSD circuit and the inductor. The current sensing circuit produces a mirror voltage at a mirror output node reflecting a driver voltage at the driver output node of the HSD circuit. Based on the mirror voltage, a mirror current proportional to the driver current is generated in a current mirror circuit. The mirror current generates a sense voltage on a sense resistor, the sense voltage being proportional to the mirror current. In this manner, sensing the sense voltage enables sensing the mirror current and, thereby, enables sensing the current input to the HSD circuit and the driver current delivered to the load circuit. To produce the mirror voltage at the mirror output node reflecting the driver voltage, the current sensing circuit also includes an amplifier circuit to amplify a difference between the mirror voltage and the driver voltage, and a cascode circuit to adjust the mirror voltage to reflect the driver voltage in response to a voltage equalizing signal from the amplifier circuit. In addition, the delivered power can be distributed over a clock period, by including a plurality of the DC-DC converters in the power distribution circuit to provide multi-phase driver currents to the load circuit.

In another exemplary aspect disclosed herein, the amplifier circuit in the current sensing circuit comprises a differential amplifier circuit to detect small differences between the driver voltage and the mirror voltage to generate the mirror current in the current sensing circuit proportional to the driver current in the HSD circuit. In one example, the differential amplifier circuit is configured with chopping circuits for offset cancellation. In this manner, an offset voltage in the differential amplifier circuit is reduced or cancelled so the mirror current is proportional to the driver current delivered to the load circuit.

In another exemplary aspect disclosed herein, the current sensing circuit can also include a voltage averaging circuit. The voltage averaging circuit includes a capacitor circuit coupled to the sense resistor to maintain an average of the sense voltage in the charge stage. The voltage averaging circuit also includes a switch to disconnect the capacitor circuit from the sense resistor in the discharging stage. In this manner, an average of the driver current delivered to the load circuit by a DC-DC converter in the power distribution circuit can be determined by employing the voltage averaging circuit.

In yet another exemplary aspect disclosed herein, a multi-phase DC-DC converter is provided that includes at least one DC-DC converter to deliver power during each of multiple phases of a clock period. In one example, a total voltage averaging circuit may also be provided to measure a total current supplied to HSD circuits in the multi-phase DC-DC converter included in the power distribution circuit. The total voltage averaging circuit is configured to sense a total of mirror currents generated by the multi-phase DC-DC converter, and the total of the mirror currents reflects a total current supplied to all of the HSD circuits. The total power supplied to the multi-phase DC-DC converter by the external power supply is the product of the supply voltage and the total current supplied to all of the HSD circuits.

In this regard in one aspect, a current sensing circuit is provided. The current sensing circuit comprises a current mirror circuit, an amplifier circuit, and a cascode circuit. The current mirror circuit comprises a power supply node coupled to an input power node, and a control node configured to be coupled to a HSD circuit of a DC-DC converter to receive a HSD control signal. The amplifier circuit comprises a first input port coupled to the current mirror circuit, and a second input port configured to be coupled to an output node of the HSD circuit. The cascode circuit is coupled to the current mirror circuit and the amplifier circuit and comprises an output port coupled to a sensing node, and a cascode control port coupled to the amplifier circuit.

In another aspect, a current sensing circuit in a DC-DC converter is provided. The current sensing circuit comprises a means for generating a mirror current based on a driver current in a HSD circuit, in response to a HSD control signal. The current sensing circuit also comprises a means for amplifying a difference between a driver voltage at an output node of the HSD circuit and a mirror voltage at an output node of the means for generating the mirror current. The current sensing circuit further comprises a means for generating a voltage equalizing signal on an output port of the means for amplifying. The voltage equalizing signal represents the amplified difference between the mirror voltage and the driver voltage. The current sensing circuit further comprises a means for adjusting the mirror voltage on the output node of the means for generating the mirror current to correspond to the driver voltage, in response to the voltage equalizing signal.

In another aspect, a method of sensing a current in a DC-DC converter is provided. The method comprises generating a mirror current based on a driver current in a HSD circuit, in response to a HSD control signal. The method further comprises amplifying a difference between a driver voltage at an output node of the HSD circuit and a mirror voltage at an output node of a current mirror circuit. The method also comprises generating a voltage equalizing signal on an output port of an amplifier circuit representing the amplified difference between the mirror voltage and the driver voltage. The method further comprises adjusting the mirror voltage at the output node of the current mirror circuit corresponding to the driver voltage, in response to the voltage equalizing signal.

In another aspect, a power distribution circuit is provided. The power distribution circuit comprises a DC-DC converter comprising a HSD circuit coupled to a supply voltage rail and an inductor. The power distribution circuit also comprises a current sensing circuit. The current sensing circuit comprises a power supply node coupled to the supply voltage rail, and a control node coupled to the HSD circuit of the DC-DC converter to receive a HSD control signal. The current sensing circuit further comprises an amplifier circuit and a cascode circuit. The amplifier circuit comprises a first input port coupled to a current mirror circuit, and a second input port configured to be coupled to an output node of the HSD circuit. The cascode circuit is coupled to the current mirror circuit and the amplifier circuit and comprises an output port coupled to a sensing node, and a cascode control port coupled to the amplifier circuit.

In another aspect, a current sensing circuit is provided. The current sensing circuit comprises a plurality of buck converter circuits of a DC-DC converter, an amplifier circuit, and a cascode circuit. Each buck converter circuit among the plurality of buck converter circuits comprises a HSD circuit, a current mirror circuit, and a control node configured to receive a HSD control signal. Each HSD circuit comprises a driver output node, and each current mirror circuit comprises a mirror output node. The amplifier circuit comprises a first input port coupled to the mirror output node of each current mirror circuit of the plurality of buck converter circuits, a second input port coupled to the driver output node of each HSD circuit of the plurality of buck converter circuits, and an amplifier output port. The cascode circuit is configured to couple the plurality of buck converter circuits to a sensing node based on a voltage equalizing signal generated on the amplifier output port.

DETAILED DESCRIPTION

Figure 1:
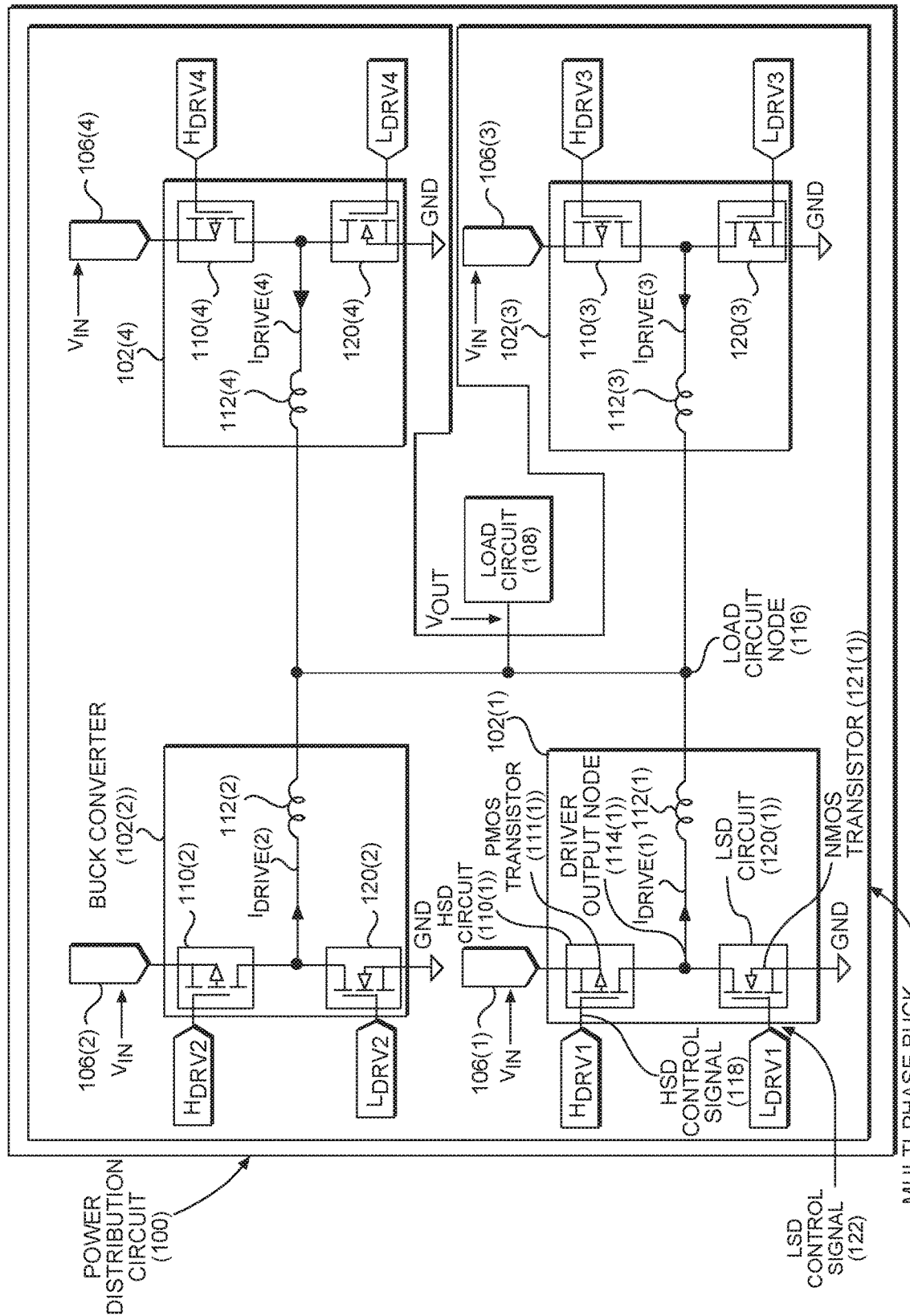
FIG. 1 is a circuit diagram of an exemplary power distribution circuit including direct current-direct current (DC) converters to distribute multi-phase power to a load circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include current sensing in an on-die direct current-direct current (DC-DC) converter for measuring delivered power. For example, one or more DC-DC converters can be included in a power distribution circuit for converting an input power supplied at an input voltage to an output power at a desired output voltage. The output power can be supplied to a load circuit to supply power to the load circuit. In one example, a plurality of DC-DC converters can be provided in the power distribution circuit to provide multi-phase driver currents. In one example, the DC-DC converter includes a high side driver (HSD) circuit configured to charge an inductor coupled between a driver output node of the HSD circuit and a load circuit node in a charging stage of operation of the DC-DC converter in response to a modulated signal. In this example, the DC-DC converter also includes a low side driver (LSD) circuit configured to couple the driver output node to a negative supply rail or ground (GND) to discharge the inductor in a discharging stage of operation of the DC-DC converter. To measure the delivered power, the DC-DC converter also includes a current sensing circuit to sense a driver current in the HSD circuit and the inductor. The current sensing circuit produces a mirror voltage at a mirror output node reflecting a driver voltage at the driver output node of the HSD circuit. Based on the mirror voltage, a mirror current proportional to the driver current is generated in a current mirror circuit. The mirror current generates a sense voltage on a sense resistor, the sense voltage being proportional to the mirror current. In this manner, sensing the sense voltage enables sensing the mirror current and, thereby, enables sensing the current input to the HSD circuit, and the driver current delivered to the load circuit. To produce the mirror voltage at the mirror output node reflecting the driver voltage, the current sensing circuit also includes an amplifier circuit to amplify a difference between the mirror voltage and the driver voltage, and a cascode circuit to adjust the mirror voltage to reflect the driver voltage in response to a voltage equalizing signal from the amplifier circuit. In addition, the delivered power can be distributed over a clock period, by including a plurality of the DC-DC converters in the power distribution circuit to provide multi-phase driver currents to the load circuit.

Figure 2:
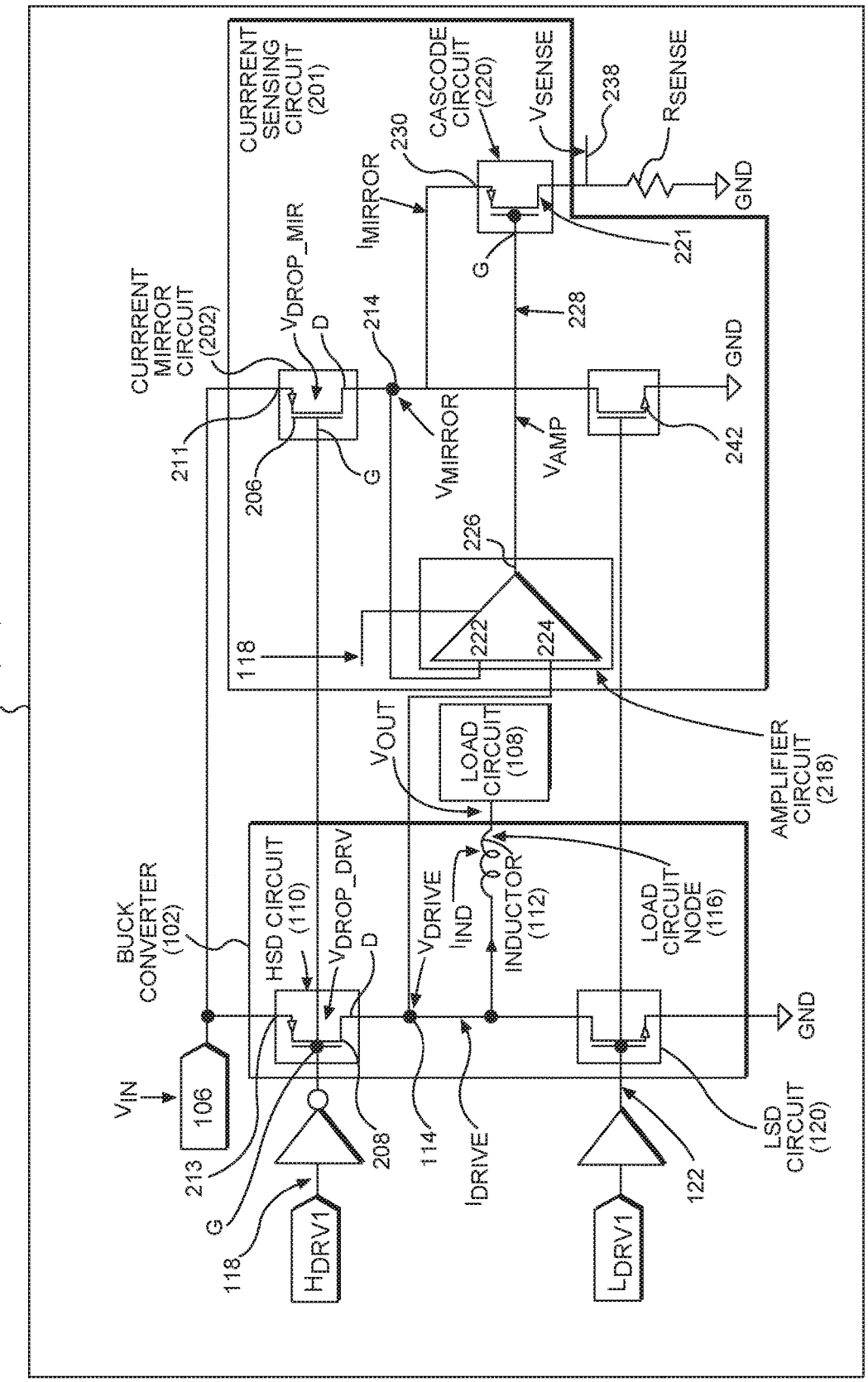
FIG. 2 is a circuit diagram of an exemplary power distribution circuit that includes a DC-DC converter and a current sensing circuit, wherein the DC-DC converter employs a high side driver (HSD) circuit and a low side driver (LSD) circuit, and the current sensing circuit is configured to generate a mirror current to generate a sense voltage that can be sensed to sense an input current supplied to the HSD circuit.

Before discussing a power distribution circuit that includes a DC-DC converter and a current sensing circuit configured to generate a mirror current to generate a sense voltage that can be sensed to sense a driver current supplied to a load circuit by the DC-DC converter, starting at FIG. 2, an exemplary on-die power distribution circuit 100 ("power distribution circuit 100") is first discussed with regard to FIG. 1. In this regard, FIG. 1 is a schematic diagram of the power distribution circuit 100 that includes four (4) buck DC-DC converters 102(1)-102(4) in a multi-phase buck DC-DC converter 104. For simplicity, only a half H-bridge circuit is shown to represent each of the buck DC-DC converters 102(1)-102(4), even though each of the buck DC-DC converters 102(1)-102(4) also includes circuitry for timing and control. The illustrated half H-bridge circuits, referred to herein as buck converters 102(1)-102(4), each include respective input power nodes 106(1)-106(4) that can be coupled to a power supply rail (not shown) to receive an input power of input voltage $V_{IN}$. The buck converters 102(1)-102(4) are each configured to generate respective driver currents $I_{DRIVE(1)}$-$I_{DRIVE(4)}$ during a charging stage of operation of the buck converters 102(1)-102(4). A modulated HSD control signal 118 and a LSD control signal 122 are supplied by a controller (not shown) during the charging stage and a discharging stage, respectively. The clock periods of the buck converters 102(2), 102(3), and 102(4) are out of phase by 90°, 180°, and 270°, respectively, relative to the clock period of the buck converter 102(1) to evenly distribute the driver currents $I_{DRIVE(1)}$-$I_{DRIVE(4)}$ generated in the respective charging stages over the clock period of the modulated HSD control signal 118.

With continuing reference to FIG. 1, the buck converter 102(1) will now be described noting that the description of the buck converter 102(1) is equally applicable to the other buck converters 102(2)-102(4) in the power distribution circuit 100. In this regard, the buck converter 102(1) includes a HSD circuit 110(1) for charging an inductor 112(1) coupled between a driver output node 114(1) of the HSD circuit 110(1) and a load circuit node 116 in response to the HSD control signal 118 being asserted. The HSD control signal 118 is asserted periodically during the charging stage of operation of the buck converters 102(1)-102(4), and not asserted during the discharging stage. In this example, the buck converter 102(1) also includes a LSD circuit 120(1) configured to couple the driver output node 114(1) to the negative supply rail or ground (GND) to discharge the inductor 112(1) in response to the LSD control signal 122 being asserted in the discharging stage. The buck converter 102(1) receives the HSD control signal 118 on an input node $H_{DRV1}$ and receives the LSD control signal 122 on an input node $L_{DRV1}$. The buck converters 102(2)-102(4) include input nodes $H_{DRV2}$-$H_{DRV4}$ and $L_{DRV2}$-$L_{DRV4}$. A load circuit 108 coupled to the load circuit node 116 smooths a voltage $V_{OUT}$ at the load circuit node 116 that can be coupled to the load circuit 108. The HSD circuit 110(1) may include a P-Type metal-oxide semiconductor (MOS) (PMOS) transistor 111(1), and the LSD circuit 120(1) may include an N-type metal-oxide semiconductor (MOS) (NMOS) transistor 121(1).

It may be desired to measure a total current delivered by a buck converter 102(1)-102(4) to the load circuit 108 coupled to the load circuit node 116 by the power distribution circuit 100. It may also be desired to measure the driver currents $I_{DRIVE(1)}$-$I_{DRIVE(4)}$ in the respective inductors 112(1)-112(4) of each of the buck converters 102(1)-102(4) for the purpose of per-phase current limiting (i.e., individually limiting the current in each phase of the multi-phase buck DC-DC converter 104). However, it can be difficult to measure the driver currents $I_{DRIVE(1)}$-$I_{DRIVE(4)}$ delivered to the load circuit 108 coupled to the load circuit node 116 without dissipating some of the power from the driver currents $I_{DRIVE(1)}$-$I_{DRIVE(4)}$. Thus, an ability to sense the driver currents $I_{DRIVE(1)}$-$I_{DRIVE(4)}$ in each of the buck converters 102(1)-102(4) with a current sensing circuit that is isolated from the buck converters 102(1)-102(4) may be desired.

In this regard, FIG. 2 illustrates an example of a power distribution circuit 200 that includes a buck converter 102. As in FIG. 1, only the half H-bridge circuit of a buck DC-DC converter is shown, and is referred to herein as buck converter 102. The buck converter 102 in FIG. 2 includes the same components as the buck converters 102(1)-102(4) in the power distribution circuit 100 of FIG. 1, which are referenced in FIG. 2 with common element numbers. Thus, the buck converter 102 will not be redescribed. The buck converter 102 is coupled to a current sensing circuit 201 in this example to generate a sense voltage $V_{SENSE}$ that can be sensed as a way to measure the power supplied to the buck converter 102 to drive a load circuit 108 coupled to a load circuit node 116. The current sensing circuit 201 includes a current mirror circuit 202 that generates a mirror current $I_{MIRROR}$ proportional to the driver current $I_{DRIVE}$ delivered by the buck converter 102, which makes it possible for the current sensing circuit 201 to sense the driver current $I_{DRIVE}$ indirectly by generating the sense voltage $V_{SENSE}$ based on the sensed mirror current $I_{MIRROR}$. In this example, the current mirror circuit 202 includes a mirror transistor 206 corresponding to a driver transistor 208 in a HSD circuit 110. The HSD control signal 118 is coupled to a gate control port G of the mirror transistor 206, and also to a gate control port G of the driver transistor 208. When the HSD control signal 118 is asserted, the mirror transistor 206 and the driver transistor 208 are driven deep into the triode region of their operating characteristics where they both essentially function as resistors. The mirror transistor 206 is sized to have a resistance that is a multiple "M" of a resistance of the driver transistor 208. Therefore, a voltage $V_{DROP\_MIR}$ across the mirror transistor 206 that is substantially equal to a voltage $V_{DROP\_DRV}$ across the driver transistor 208 will cause the mirror current $I_{MIRROR}$ in the mirror transistor 206 to be proportional (i.e., a current transfer ratio of 1/"M") to the driver current $I_{DRIVE}$ in the driver transistor 208.

To achieve a voltage across the mirror transistor 206 that is substantially equal to a voltage across the driver transistor 208, a power supply node 211 of the mirror transistor 206 and a power supply node 213 of the driver transistor 208 are both coupled to the input voltage $V_{IN}$ at the input power node 106, and a mirror voltage $V_{MIRROR}$ at a mirror output node 214 of the current mirror circuit 202 is made substantially equal to a driver voltage $V_{DRIVE}$ on the driver output node 114 of the HSD circuit 110. This is accomplished by amplifying a difference between the mirror voltage $V_{MIRROR}$ and the driver voltage $V_{DRIVE}$ using an amplifier circuit 218, in response to the HSD control signal 118, and adjusting the mirror voltage $V_{MIRROR}$ using a cascode circuit 220 to reflect the driver voltage $V_{DRIVE}$ based on the amplified difference. In this example, the mirror transistor 206 and the driver transistor 208 are both P-type MOS (PMOS) transistors. The mirror output node 214 is coupled to a drain D of the mirror transistor 206, and the driver output node 114 is coupled to a drain D of the driver transistor 208.

The amplifier circuit 218 includes a first input port 222 coupled to the mirror output node 214, and a complement input port 224 coupled to the driver output node 114. The first input port 222 and the complement input port 224 may correspond to an inverting port and a non-inverting port, respectively, of the amplifier circuit 218, or to a non-inverting port and an inverting port, respectively. The amplifier circuit 218 also includes an amplifier output port 226 on which a voltage equalizing signal 228 is generated. An amplifier voltage $V_{AMP}$ of the voltage equalizing signal 228 represents the amplified difference between the mirror voltage $V_{MIRROR}$ and the driver voltage $V_{DRIVE}$.

The cascode circuit 220 in this example comprises a cascode transistor 221. An input port 230 of the cascode circuit 220 is coupled to the mirror output node 214, and a cascode control port G is coupled to the amplifier output port 226 of the amplifier circuit 218 to receive the voltage equalizing signal 228. The voltage equalizing signal 228 controls the cascode transistor 221 operating in a saturated region to adjust the mirror current $I_{MIRROR}$. With the cascode transistor 221 coupled in series between the mirror transistor 206 and a sense resistor $R_{SENSE}$, the mirror current $I_{MIRROR}$ changes in accordance with changes to the mirror voltage $V_{MIRROR}$ at the mirror output node 214. For example, as the amplifier voltage $V_{AMP}$ of the voltage equalizing signal 228 decreases, the mirror voltage $V_{MIRROR}$ on the mirror output node 214 decreases, the voltage $V_{DROP\_MIR}$ across the mirror transistor 206 increases, and the mirror current $I_{MIRROR}$ increases. As the amplifier voltage $V_{AMP}$ of the voltage equalizing signal 228 increases, the mirror voltage $V_{MIRROR}$ on the mirror output node 214 increases, the voltage $V_{DROP\_MIR}$ across the mirror transistor 206 decreases, and the mirror current $I_{MIRROR}$ decreases.

The mirror current $I_{MIRROR}$ in the sense resistor $R_{SENSE}$ of FIG. 2 generates, at a sensing node 238, the sense voltage $V_{SENSE}$ having an amplitude with a particular proportional relationship to the mirror current $I_{MIRROR}$. The sense voltage $V_{SENSE}$ is therefore proportional to the driver current $I_{DRIVE}$. In this regard, the driver current $I_{DRIVE}$ can be indirectly measured by measuring the sense voltage $V_{SENSE}$ generated across the sense resistor $R_{SENSE}$ during the charging stage of operation of the buck converter 102 (i.e., while the HSD control signal 118 is asserted). By trimming a resistance of the sense resistor $R_{SENSE}$, the accuracy of the driver current $I_{DRIVE}$ measurement can be controlled. When the HSD control signal 118 is not asserted during the discharging stage of the operation of the buck converter 102, the current mirror circuit 202 is turned off, and the mirror output node 214 is coupled to the negative supply rail or ground (GND) by a pull-down transistor 242 such that the sense voltage $V_{SENSE}$ across the sense resistor $R_{SENSE}$ is zero (0). The pull-down transistor 242 may be an NMOS transistor as a non-limiting example.

Figure 3:
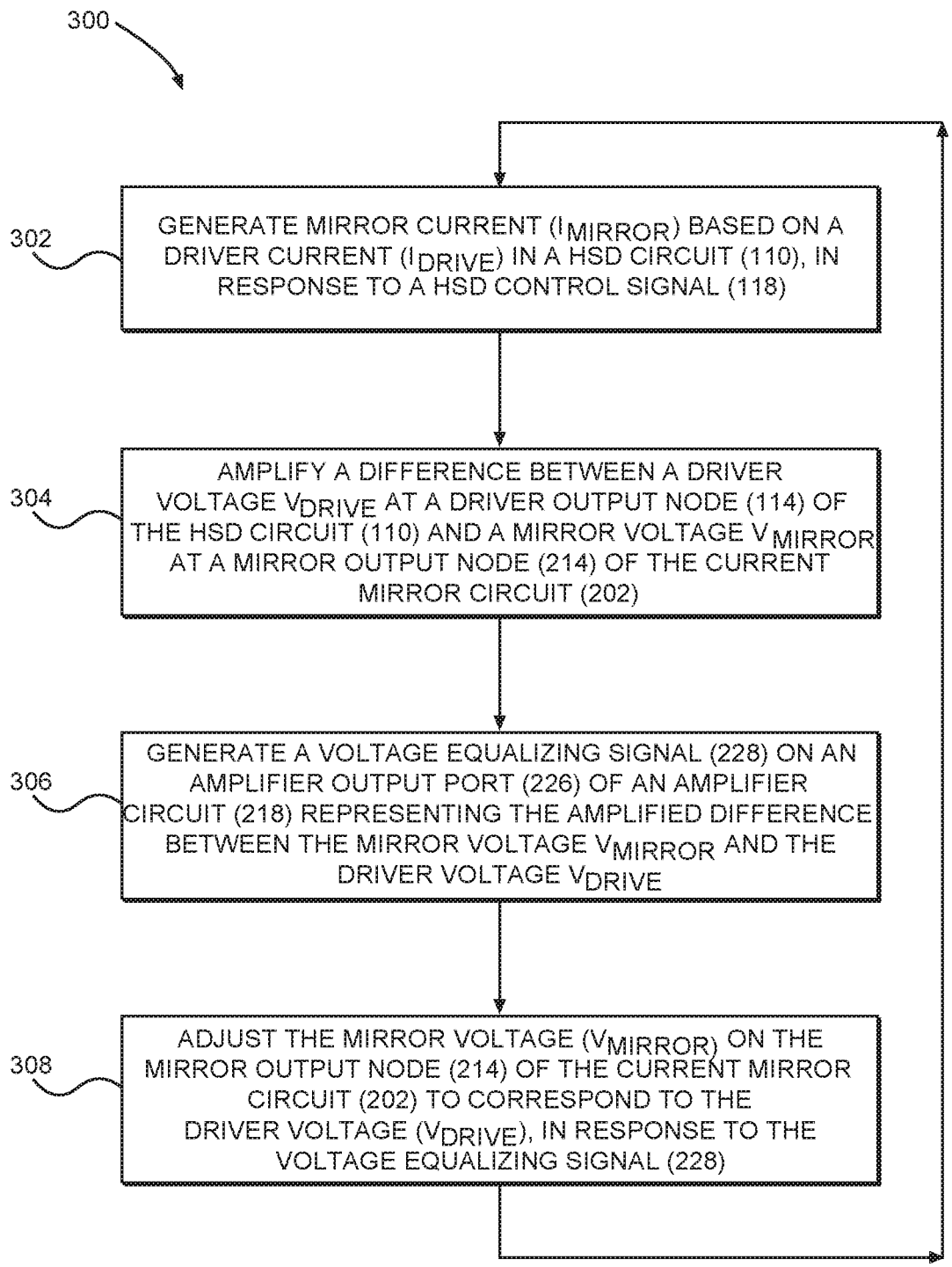
FIG. 3 is a flowchart illustrating an exemplary process of the current sensing circuit in the power distribution circuit in FIG. 2 sensing current delivered to a load circuit by the DC-DC converter in FIG. 2.

FIG. 3 is a flowchart illustrating an exemplary process 300 of the current sensing circuit 201 in the power distribution circuit 200 in FIG. 2 sensing the driver current $I_{DRIVE}$ delivered to the load circuit 108 through the inductor 112 by the buck converter 102 in FIG. 2. In this regard, as illustrated of FIG. 3, the process 300 includes the current sensing circuit 201 generating a mirror current $I_{MIRROR}$ based on a driver current $I_{DRIVE}$ in the HSD circuit 110, in response to a HSD control signal 118 (block 302). The process 300 also includes the current sensing circuit 201 amplifying a difference between a driver voltage $V_{DRIVE}$ at a driver output node 114 of the HSD circuit 110 and a mirror voltage $V_{MIRROR}$ at a mirror output node 214 of the current mirror circuit 202 (block 304). The process 300 also includes the current sensing circuit 201 generating a voltage equalizing signal 228 on an amplifier output port 226 of an amplifier circuit 218 representing the amplified difference between the mirror voltage $V_{MIRROR}$ and the driver voltage $V_{DRIVE}$ (block 306). The process 300 also includes the current sensing circuit 201 adjusting the mirror voltage $V_{MIRROR}$ on the mirror output node 214 of the current mirror circuit 202 to correspond to the driver voltage $V_{DRIVE}$, in response to the voltage equalizing signal 228 (block 308).

Figure 4A:
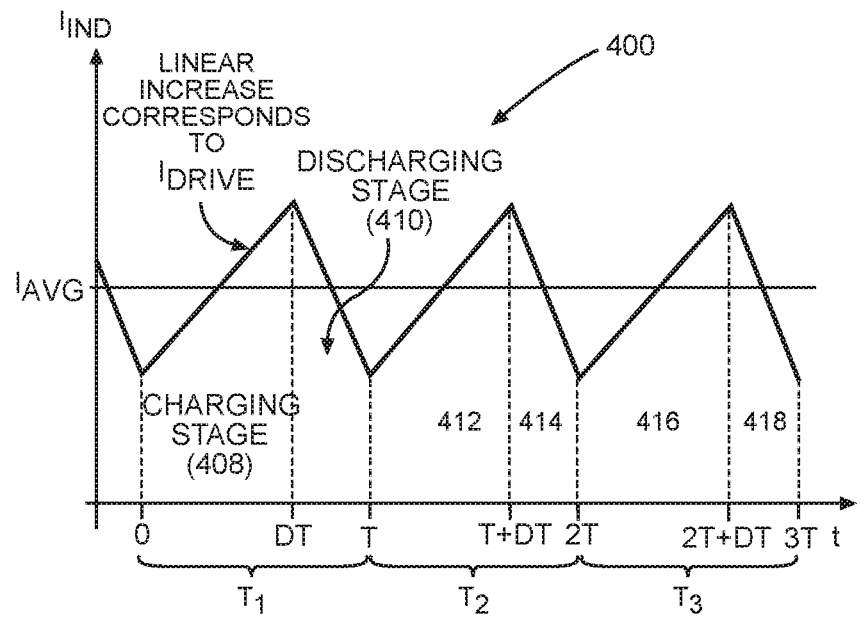
FIG. 4A is a timing diagram illustrating exemplary current levels in an inductor coupled to the HSD circuit of FIG. 2.

FIG. 4A is a timing diagram 400 illustrating exemplary levels of an inductor current $I_{IND}$ in the inductor 112 in the buck converter 102 of the power distribution circuit 200 in FIG. 2 during a first clock period $T_1$, a second clock period $T_2$, and a third clock period $T_3$ from time (t) 0 to time 3T. In the timing diagram 400, time 0 to time DT corresponds to a charging stage 408 of operation of the buck converter 102 in the first clock period $T_1$, during which the HSD control signal 118 is asserted, and the HSD circuit 110 is turned on. As shown, the inductor current $I_{IND}$ corresponds to the driver current $I_{DRIVE}$, which linearly increases during the charging stage 408 due to a constant voltage being applied across the inductor 112. Specifically, the inductor 112 is coupled between the load circuit node 116 and the driver output node 114 as previously shown. A voltage $V_{OUT}$ (not shown) on the load circuit node 116 is held substantially constant by a load capacitor $C_{LOAD}$ (not shown). The driver voltage $V_{DRIVE}$ remains constant during the charging stage 408 at a voltage level close to the input voltage $V_{IN}$, as follows. By sizing the driver transistor 208 to have a turn on resistance set as low as possible, while constraining the size to limit switching losses, power losses (i.e., $I^2R$ losses) in the driver transistor 208 that would reduce conversion efficiency are avoided. With a small turn on resistance, the voltage drop across the driver transistor 208 is very small, and the driver voltage $V_{DRIVE}$ on the driver output node 114 remains constant near the input voltage $V_{IN}$. A constant voltage (approximately $V_{IN}$-$V_{OUT}$) across the inductor 112 in the charging stage 408 causes the driver current $I_{DRIVE}$ to linearly increase. Returning to the timing diagram 400, time DT to time T corresponds to a discharging stage 410 of operation of the buck converter 102 in the first clock period $T_1$, during which the inductor current $I_{IND}$ in the inductor 112 linearly decreases. In the discharging stage 410 of the first clock period $T_1$, from time DT to time T, the HSD control signal 118 is not asserted and the HSD circuit 110 is turned off so that the driver current $I_{DRIVE}$ drops to zero. The LSD control signal 122 is asserted during the discharging stage 410, and the LSD circuit 120 is turned on. With the driver output node 114 coupled to the negative supply rail or ground (GND) by the LSD circuit 120, the voltage $V_{OUT}$ is applied across the inductor 112. At time T, the discharging stage 410 of the first clock period $T_1$ ends, and the cycle is repeated. As in the charging stage 408 of the first clock period $T_1$, the driver current $I_{DRIVE}$ linearly increases during a charging stage 412, from time T to time T+DT, and during a charging stage 416, from time 2T to time 2T+DT. As in the discharging stage 410 of the first clock period $T_1$, the driver current $I_{DRIVE}$ drops to zero during a discharging stage 414, from time T+DT to time 2T, and during a discharging stage 418, from time 2T+DT to time 3T. An average inductor current $I_{AVG}$ of the inductor current $I_{IND}$ in the inductor 112 is indicated by a horizontal line in FIG. 4A.

Figure 4B:
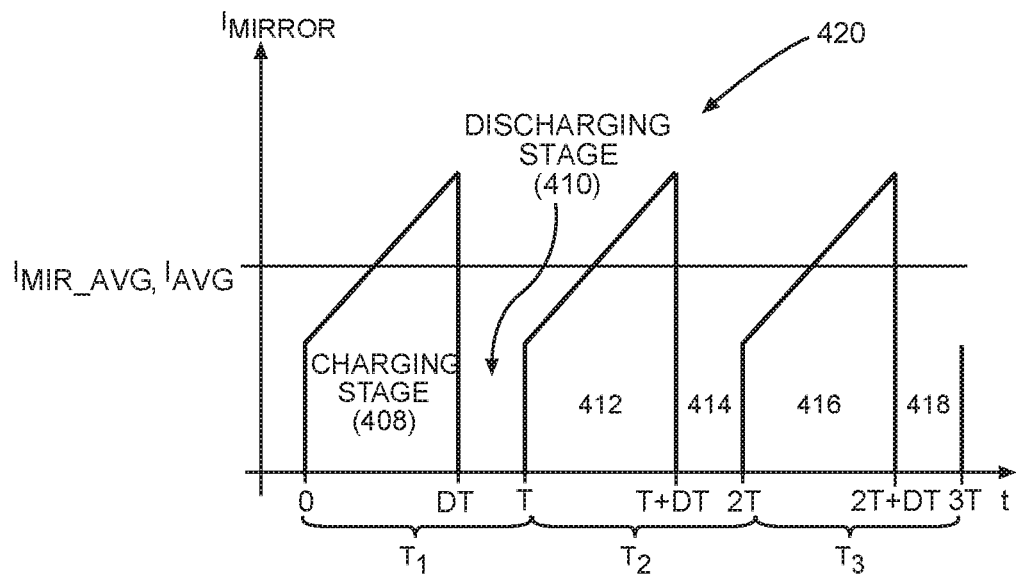
FIG. 4B is a timing diagram illustrating exemplary current levels of a mirror current in the current sensing circuit of FIG. 2, wherein the level of mirror current multiplied by a mirror factor ("M") corresponds to the current in the HSD circuit.

FIG. 4B is a timing diagram 420 illustrating exemplary levels of the mirror current $I_{MIRROR}$ in the sense resistor $R_{SENSE}$ in FIG. 2 during the first, second, and third clock periods $T_1$, $T_2$, and $T_3$ shown in FIG. 4A. The sense voltage $V_{SENSE}$ at the sensing node 238 of FIG. 2 is proportional to the illustrated levels of the mirror current $I_{MIRROR}$. Time 0 to time DT in FIG. 4B corresponds to the charging stage 408 of the first clock period $T_1$, and time DT to time T corresponds to the discharging stage 410 of the first clock period $T_1$. The linear increase of the mirror current $I_{MIRROR}$ in the sense resistor $R_{SENSE}$ shown in FIG. 4B (time 0 to time DT) corresponds to the linear increase of the inductor current $I_{IND}$ in the inductor 112 during the charging stage 408, as shown in FIG. 4A. However, during the discharging stage 410 between time DT and time T, the mirror output node 214 is coupled to the negative supply rail or ground (GND) by the pull-down transistor 242, so that the level of the mirror current $I_{MIRROR}$ in the sense resistor $R_{SENSE}$ becomes zero (0). Thus, the mirror current $I_{MIRROR}$ does not correspond to the inductor current $I_{IND}$ during the discharging stage 410.

The average inductor current $I_{AVG}$ during the entire first clock period $T_1$ is the same as the average inductor current $I_{AVG}$ during only the charging stage 408. Since the inductor current $I_{IND}$ corresponds to the driver current $I_{DRIVE}$ during the charging stage 408, and the mirror current $I_{MIRROR}$ is proportional to the driver current $I_{DRIVE}$, the average inductor current $I_{AVG}$ over the entire first clock period $T_1$ can be measured by measuring an average $I_{MIR\_AVG}$ of the mirror current $I_{MIRROR}$ in the sense resistor $R_{SENSE}$ during the charging stage 408. The zero value of the mirror current $I_{MIRROR}$ during the discharging stage 410 is not used. A schematic diagram of an exemplary circuit to determine the average mirror current $I_{MIR\_AVG}$ based on the sense voltage $V_{SENSE}$ in FIG. 2, to determine the average inductor current $I_{AVG}$, is illustrated in FIG. 5.

Figure 5:
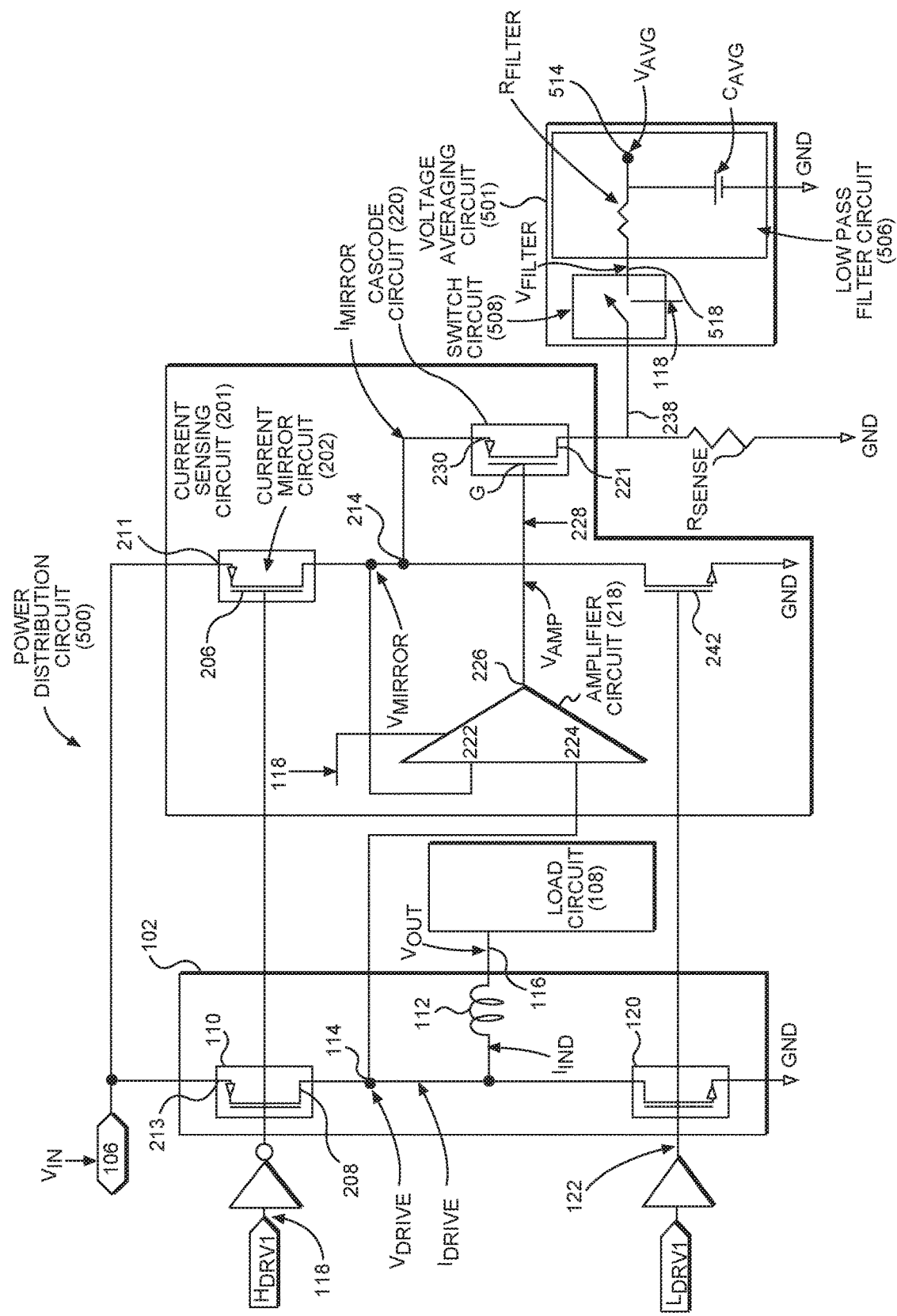
FIG. 5 is a circuit diagram of the power distribution circuit of FIG. 2, wherein the current sensing circuit further employs an exemplary voltage averaging circuit to measure an average output voltage corresponding to the current in the inductor coupled between a driver output node of the HSD circuit and a load circuit node of the DC-DC converter.

FIG. 5 is a schematic diagram of a power distribution circuit 500 that includes the power distribution circuit 200 of FIG. 2, and further includes a voltage averaging circuit 501 that is configured to accurately measure the average inductor current $I_{AVG}$ by sensing the sense voltage $V_{SENSE}$ during the charging stage 408, but not during the discharging stage 410. The voltage averaging circuit 501 is coupled to the current sensing circuit 201. As discussed above, the buck converter 102 of FIG. 2 corresponds to any one of the four (4) buck converters 102(1)-102(4) in the multi-phase buck DC-DC converter 104 of FIG. 1. The voltage averaging circuit 501 determines an average voltage $V_{AVG}$ corresponding to the average mirror current $I_{MIR\_AVG}$ of FIGS. 2 and 4B of the driver current $I_{DRIVE}$ in the inductor 112, which can be used for the purpose of per-phase monitoring in the multi-phase buck DC-DC converter 104. The voltage averaging circuit 501 is configured to average the sense voltage $V_{SENSE}$ (FIG. 2) at the sensing node 238 by sensing the sense voltage $V_{SENSE}$ during the charging stage 408 (time 0 to time DT) of the first clock period $T_1$, noted by example in FIG. 4B, but not during the discharging stage 410 (time DT to time T of FIG. 4B). The voltage averaging circuit 501 includes the sense resistor $R_{SENSE}$, a low pass filter circuit 506, and a switch circuit 508. The switch circuit 508 is controlled by the HSD control signal 118 to close in the charging stage 408 to couple the sensing node 238 to the low pass filter circuit 506, which averages the sense voltage $V_{SENSE}$. The low pass filter circuit 506 smooths the sense voltage $V_{SENSE}$ at the sensing node 238 using a filter resistor $R_{FILTER}$ coupling the switch circuit 508 to an averaging node 514, and an averaging capacitor $C_{AVG}$ coupled between the averaging node 514 and the negative supply rail or ground (GND). In the charging stage 408, the sense voltage $V_{SENSE}$ is induced on the averaging node 514 of the averaging capacitor $C_{AVG}$, and the averaging capacitor $C_{AVG}$ is charged based on the sense voltage $V_{SENSE}$. In the discharging stage 410, the HSD control signal 118 is not asserted, and the switch circuit 508 is opened to prevent the averaging capacitor $C_{AVG}$ from discharging through the filter resistor $R_{FILTER}$ and the sense resistor $R_{SENSE}$ to the negative supply rail or ground (GND). Thus, during the discharging stage 410, the averaging capacitor $C_{AVG}$ remains charged to the average voltage $V_{AVG}$ of the sense voltage $V_{SENSE}$ during the charging stage 408. Therefore, the average voltage $V_{AVG}$ at the averaging node 514 represents the average inductor current $I_{AVG}$ over the entire first clock period $T_1$.

Figure 6:
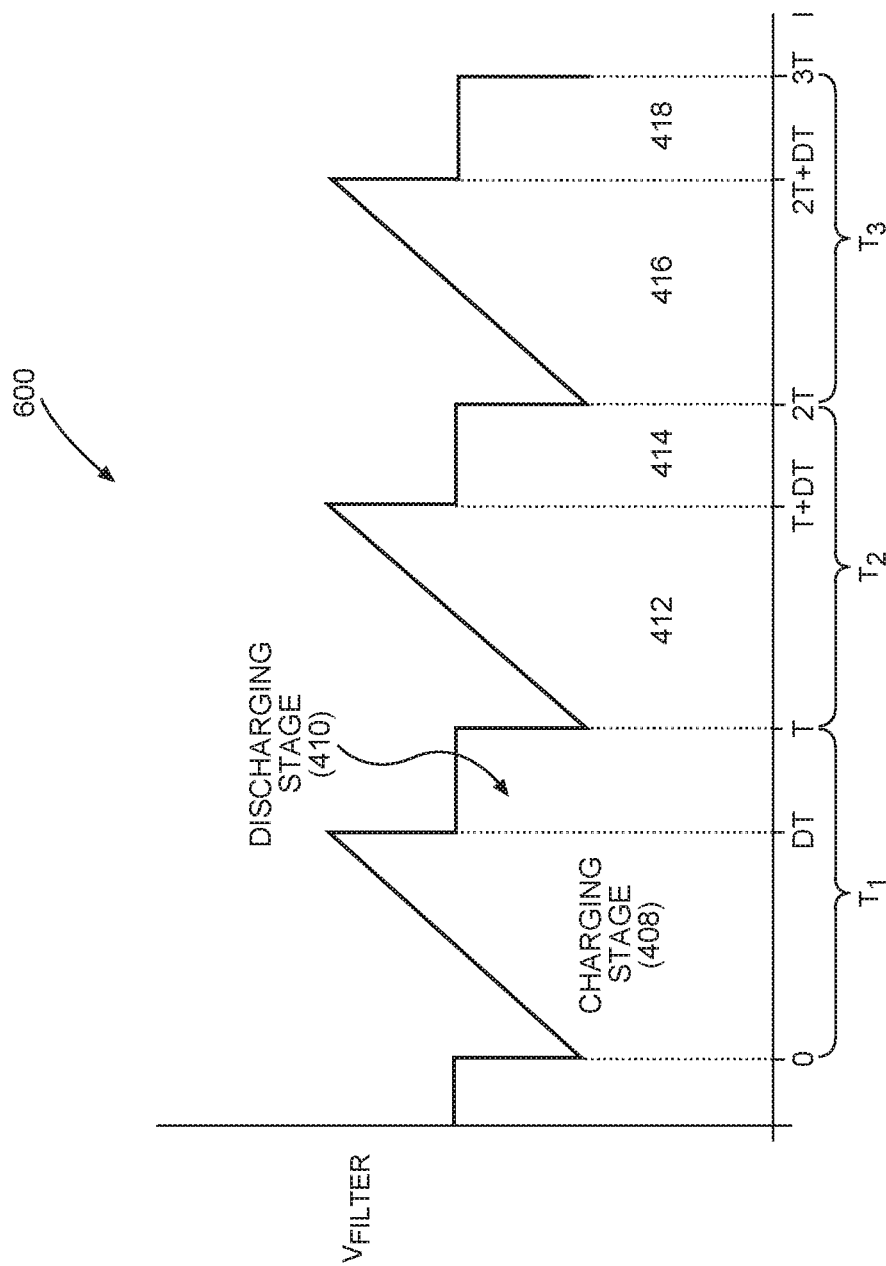
FIG. 6 is a timing diagram illustrating exemplary voltage levels at a node of the voltage averaging circuit in the power distribution circuit of FIG. 5.

A timing diagram 600 of exemplary levels of a filter input voltage $V_{FILTER}$ between the switch circuit 508 and the low pass filter circuit 506 of FIG. 5 is illustrated in FIG. 6. The timing diagram 600 is used to explain how the average voltage $V_{AVG}$ at the averaging node 514 represents the average inductor current $I_{AVG}$. Time 0 to time 3T in the timing diagram 600 of FIG. 6 corresponds to the clock periods $T_1$, $T_2$, and $T_3$ in the timing diagrams 400 and 420 of FIGS. 4A and 4B. As discussed previously, the sense voltage $V_{SENSE}$ linearly increases during the charging stage 408, from time 0 to time DT. FIG. 5 shows the filter input voltage $V_{FILTER}$ at a node 518 linearly rising according to the sense voltage $V_{SENSE}$ at the sensing node 238. The filter input voltage $V_{FILTER}$ charges the averaging capacitor $C_{AVG}$ through $R_{FILTER}$ during the charging stage 408. As the charging stage 408 ends, the HSD control signal 118 is no longer asserted, and the switch circuit 508 is opened. During the discharging stage 410 (time DT to time T), the node 518 is not coupled to the sensing node 238, and the filter input voltage $V_{FILTER}$ becomes the average voltage $V_{AVG}$ on the averaging capacitor $C_{AVG}$. Thus, the average voltage $V_{AVG}$ on the averaging node 514 maintains a voltage level based on an average of the sense voltage $V_{SENSE}$ during the charging stage 408, which can be used to determine the average inductor current $I_{AVG}$. Therefore, the average inductor current $I_{AVG}$ can be monitored at the averaging node 514. As discussed above, it can be useful to measure the driver current $I_{DRIVE}$ in the inductor 112 of the buck converter 102 for the purpose of balancing the per-phase inductor current $I_{IND}$. In addition, by monitoring the average voltage $V_{AVG}$ at the averaging node 514, it is possible to achieve per-phase current limiting.

Figure 7:
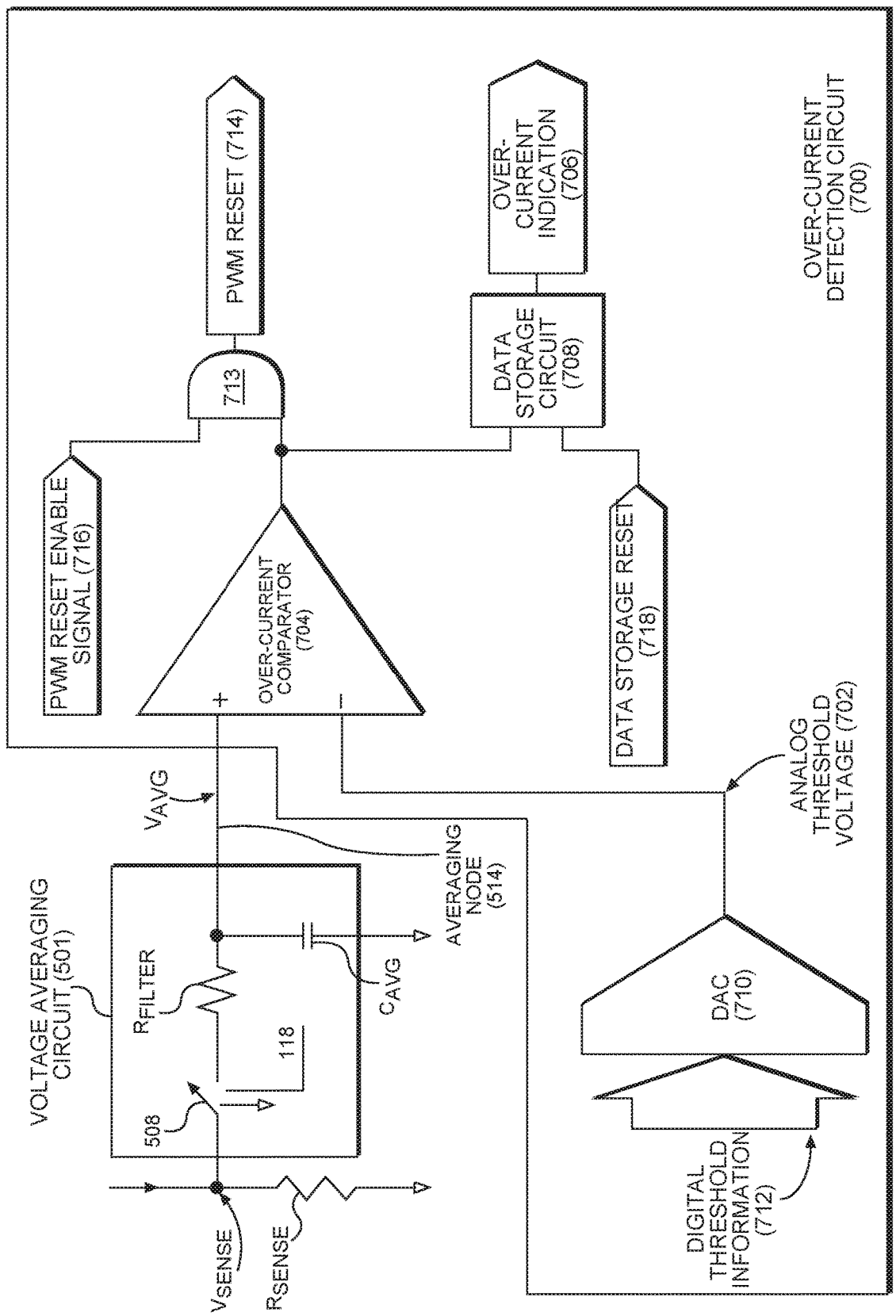
FIG. 7 is a circuit diagram of an exemplary over-current detection circuit configured to receive the average output voltage generated by the voltage averaging circuit of FIG. 5 to generate an over-current indication signal based on the average output voltage.

FIG. 7 is a schematic diagram of the voltage averaging circuit 501 of FIG. 5 coupled to an over-current detection circuit 700. The over-current detection circuit 700 in this example is used to determine that the average voltage $V_{AVG}$ equals or exceeds an analog threshold voltage 702. Such a determination can be used for per-phase current limiting, for example. In this regard, an over-current comparator 704 compares the average voltage $V_{AVG}$ at the averaging node 514 to the analog threshold voltage 702. If the average voltage $V_{AVG}$ becomes equal to or higher than the analog threshold voltage 702, and the over-current comparator 704 is enabled, the over-current comparator 704 generates an over-current indication 706, which can be stored in a data storage circuit 708. The analog threshold voltage 702 can be supplied to the over-current comparator 704 from a digital-to-analog converter (DAC) 710. In response to receiving digital threshold information 712, the DAC 710 converts the digital threshold information 712 to the analog threshold voltage 702. A pulse-width modulated (PWM) reset 714 is generated if the over-current indication 706 is activated and the PWM reset 714 is enabled based on a PWM reset enable signal 716.

Specifically, the over-current indication 706 and the PWM reset enable signal 716 are received at an AND-based circuit 713, which generates the PWM reset 714. PWM control logic (not shown) may use the PWM reset 714 to reduce the average driver current $I_{DRV\_AVG}$ (not shown). In addition, the over-current indication 706 may be stored in the data storage circuit 708, for example. In one example, the PWM control logic may receive the PWM reset 714 from each phase of the multi-phase buck DC-DC converter 104, and the data storage circuit 708 of each phase can be read to determine which phase reached the analog threshold voltage 702. Once the value of the data storage circuit 708 has been read, the data storage circuit 708 is reset by a data storage reset 718.

Accuracy of the over-current indication 706 is dependent on the over-current comparator 704 comparing the analog threshold voltage 702 and the average voltage $V_{AVG}$. In turn, accuracy of the average voltage $V_{AVG}$ depends on the mirror current $I_{MIRROR}$ accurately reflecting the driver current $I_{DRIVE}$. It was previously noted that the mirror current $I_{MIRROR}$ is a fraction of the driver current $I_{DRIVE}$, based on a current transfer ratio of 1/"M", so an error in the mirror current $I_{MIRROR}$ would cause an error in measurement of the driver current $I_{DRIVE}$, with the measurement error being a multiple of the error in the mirror current $I_{MIRROR}$. Since the mirror current $I_{MIRROR}$ is based on the mirror voltage $V_{MIRROR}$, making the mirror voltage $V_{MIRROR}$ as close as possible to the driver voltage $V_{DRIVE}$ is extremely important for accurate power measurement. Also, in an example of an IC employing the power distribution circuit 100 of FIG. 1, clock periods may be less than ten (10) nanoseconds (ns). Thus, accuracy of the measurement of the driver current $I_{DRIVE}$ depends on the amplifier circuit 218 being able to detect and quickly correct small differences between the mirror voltage $V_{MIRROR}$ and the driver voltage $V_{DRIVE}$.

Figure 8:
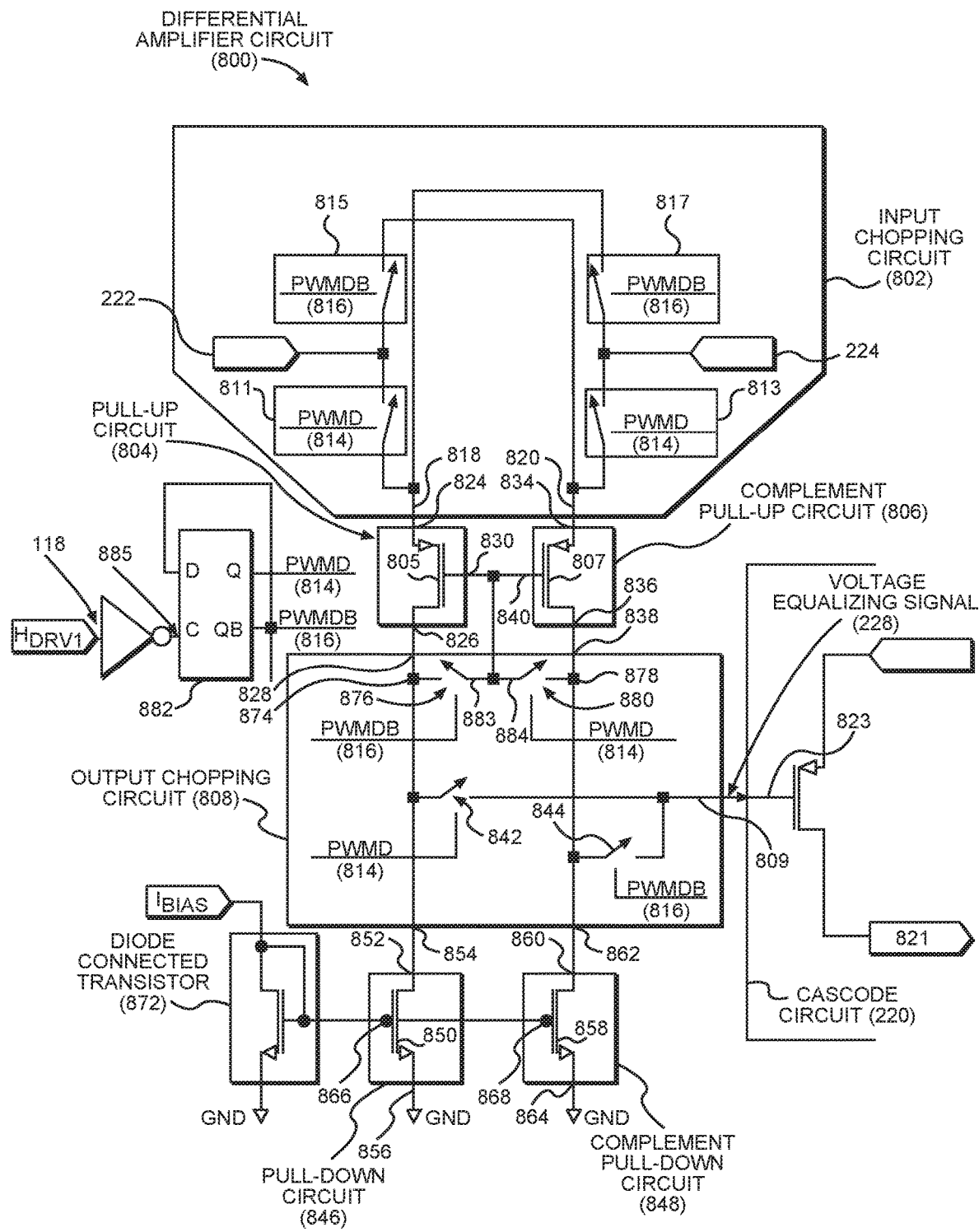
FIG. 8 is a circuit diagram of an exemplary differential amplifier circuit provided as an example of the amplifier circuit in the current sensing circuit of the power distribution circuit of FIG. 2, the differential amplifier circuit employing chopping circuits for offset voltage cancellation.

FIG. 8 is a circuit diagram of an exemplary differential amplifier circuit 800, which is an example of the amplifier circuit 218 in the current mirror circuit 202 in FIG. 2 that can be employed to detect small differences between voltage levels of two (2) inputs, and quickly generate the voltage equalizing signal 228 to the cascode circuit 220 to adjust the mirror voltage $V_{MIRROR}$ to correct such differences. The differential amplifier circuit 800 includes an input chopping circuit 802, a pull-up circuit 804, a complement pull-up circuit 806, and an output chopping circuit 808. Ideally, the pull-up circuit 804 and the complement pull-up circuit 806 on opposite sides of the symmetrical configuration of the differential amplifier circuit 800 would have balanced characteristics. However, fabrication variations may cause small differences. For example, the pull-up circuit 804 may include a pull-up transistor 805, and the complement pull-up circuit 806 may include a complement pull-up transistor 807. The pull-up transistor 805 and the complement pull-up transistor 807 may be PMOS transistors with different threshold voltages, which will be referred to herein as an offset voltage. As a result, the voltage equalizing signal 228 would indicate that the mirror voltage $V_{MIRROR}$ is equal to the driver voltage $V_{DRIVE}$ when there is actually a difference between the mirror voltage $V_{MIRROR}$ and the driver voltage $V_{DRIVE}$ equal to the offset voltage. To address the offset voltage, the differential amplifier circuit 800 employs the input chopping circuit 802 and the output chopping circuit 808 for offset voltage cancellation. The input and output chopping circuits 802 and 808 iteratively reverse the coupling between the first input port 222 and the complement input port 224 to the pull-up circuit 804 and the complement pull-up circuit 806, and iteratively reverse the coupling of the pull-up circuit 804 and the complement pull-up circuit 806 to an output node 809 that is coupled to the amplifier output port 226 (not shown). By iteratively reversing coupling between the pull-up circuit 804 and the complement pull-up circuit 806 to the first input port 222 and the complement input port 224 and the output node 809, the offset voltage is iteratively made positive and negative, and therefore cancelled over time. In the input chopping circuit 802, the chopping is controlled by a chopping control signal (PWMD) 814 and a complement chopping control signal (PWMDB) 816, which is a complement of the chopping control signal (PWMD) 814, as explained below.

In response to the chopping control signal (PWMD) 814, a first input switch 811 in the input chopping circuit 802 couples the first input port 222 to an output node 818, and a complement second input switch 813 in the input chopping circuit 802 couples the complement input port 224 to a complement output node 820. In response to the complement chopping control signal (PWMDB) 816, a complement first input switch 815 of the input chopping circuit 802 couples the first input port 222 to the output node 818, and a complement second input switch 817 in the input chopping circuit 802 couples the complement input port 224 to the complement output node 820. In this regard, the input chopping circuit 802 alternates coupling of the first input port 222 and the complement input port 224 to the output node 818 and the complement output node 820 of the input chopping circuit 802, in response to the chopping control signal (PWMD) 814 and the complement chopping control signal (PWMDB) 816.

The pull-up circuit 804 and the complement pull-up circuit 806 alternately receive voltages on the first input port 222 and the complement input port 224 from the input chopping circuit 802. The pull-up circuit 804 and the complement pull-up circuit 806 are implemented, respectively, by the pull-up transistor 805 and the complement pull-up transistor 807. The pull-up transistor 805 includes an input node 824 coupled to the output node 818 of the input chopping circuit 802, an output node 826 coupled to an input node 828 of the output chopping circuit 808, and a pull-up gate control node 830. The complement pull-up transistor 807 includes an input node 834 coupled to the complement output node 820 of the input chopping circuit 802, an output node 836 coupled to a complement input node 838 of the output chopping circuit 808, and a complement pull-up gate control node 840.

The output nodes 826 and 836 of the pull-up circuit 804 and the complement pull-up circuit 806 are alternately coupled by the output chopping circuit 808 to a cascode output port 821 to control the cascode circuit 220, in response to the chopping control signal (PWMD) 814 and the complement chopping control signal (PWMDB) 816. To implement this aspect of the chopping, the output chopping circuit 808 couples the cascode output port 821 to a cascode control node 823 of the cascode circuit 220. In response to the chopping control signal (PWMD) 814, an output switch 842 of the output chopping circuit 808 couples the input node 828 to the cascode output port 821 and, in response to the complement chopping control signal (PWMDB) 816, a complement output switch 844 of the output chopping circuit 808 couples the complement input node 838 to the cascode output port 821.

As part of the differential amplifier circuit 800, a pull-down circuit 846 and a complement pull-down circuit 848 are coupled between the output chopping circuit 808 and the negative supply rail or ground (GND). The pull-down circuit 846 includes a pull-down transistor 850 having an input node 852 coupled to an output node 854 of the output chopping circuit 808, and an output node 856 coupled to the negative supply rail or ground (GND). The complement pull-down circuit 848 includes a complement pull-down transistor 858 having an input node 860 coupled to a complement output node 862 of the output chopping circuit 808, and an output node 864 coupled to the negative supply rail or ground (GND). A pull-down gate control node 866 of the pull-down transistor 850 and a complement pull-down gate control node 868 of the complement pull-down transistor 858 receive a bias current $I_{BIAS}$ from a diode connected transistor 872, based on the HSD control signal 118.

Returning to the output chopping circuit 808, either the output node 826 of the pull-up transistor 805 or the output node 836 of the complement pull-up transistor 807 is coupled to the pull-up gate control node 830 and the complement pull-up gate control node 840, in response to the chopping control signal (PWMD) 814 and the complement chopping control signal (PWMDB) 816. Specifically, the input node 828 of the output chopping circuit 808 is coupled to the output node 854 and to a first node 874 of a bias switch 876. The complement input node 838 of the output chopping circuit 808 is coupled to the complement output node 862 and to a first node 878 of a complement bias switch 880. A second node 883 of the bias switch 876 and a second node 884 of the complement bias switch 880 are both coupled to the pull-up gate control node 830 and to the complement pull-up gate control node 840. The bias switch 876 and the complement bias switch 880 are controlled by the complement chopping control signal (PWMDB) 816 and the chopping control signal (PWMD) 814, respectively.

The differential amplifier circuit 800 of FIG. 8 is capable of quickly responding to a small difference in voltage between the mirror voltage $V_{MIRROR}$ and the driver voltage $V_{DRIVE}$, even if the threshold voltages of the pull-up transistor 805 and the complement pull-up transistor 807 differ. The cascode output port 821 provides the voltage equalizing signal 228 to the cascode circuit 220.

As noted above, the complement chopping control signal (PWMDB) 816 is a complement of the chopping control signal (PWMD) 814. The chopping control signal (PWMD) 814 and the complement chopping control signal (PWMDB) 816 are provided by a true output Q and a complementary output QB, respectively, of a HSD clocked latch 882. A clock input C of the HSD clocked latch 882 receives an inverted HSD control signal 885 based on the HSD control signal 118, and a data input D is coupled to the complementary output QB. Thus, the value of the chopping control signal (PWMD) 814 and the complement chopping control signal (PWMDB) 816 are inverted in response to each falling edge (i.e., a transition from logical "1" to logical "0") of the HSD control signal 118, which occurs once every clock period. As a result, a full iteration of the chopping employed in the differential amplifier circuit 800 takes two (2) clock periods. The HSD control signal 118 clocking the HSD clocked latch 882 in FIG. 8 is labeled "$H_{DRV1}$" indicating an HSD control signal 118 for the first phase of the multi-phase buck DC-DC converter 104. For differential amplifier circuits 800 operating in the second, third, and fourth phases, for example, the corresponding HSD control signals 118 may be labeled $H_{DRV2}$, $H_{DRV3}$, and $H_{DRV4}$, respectively.

Figure 9:
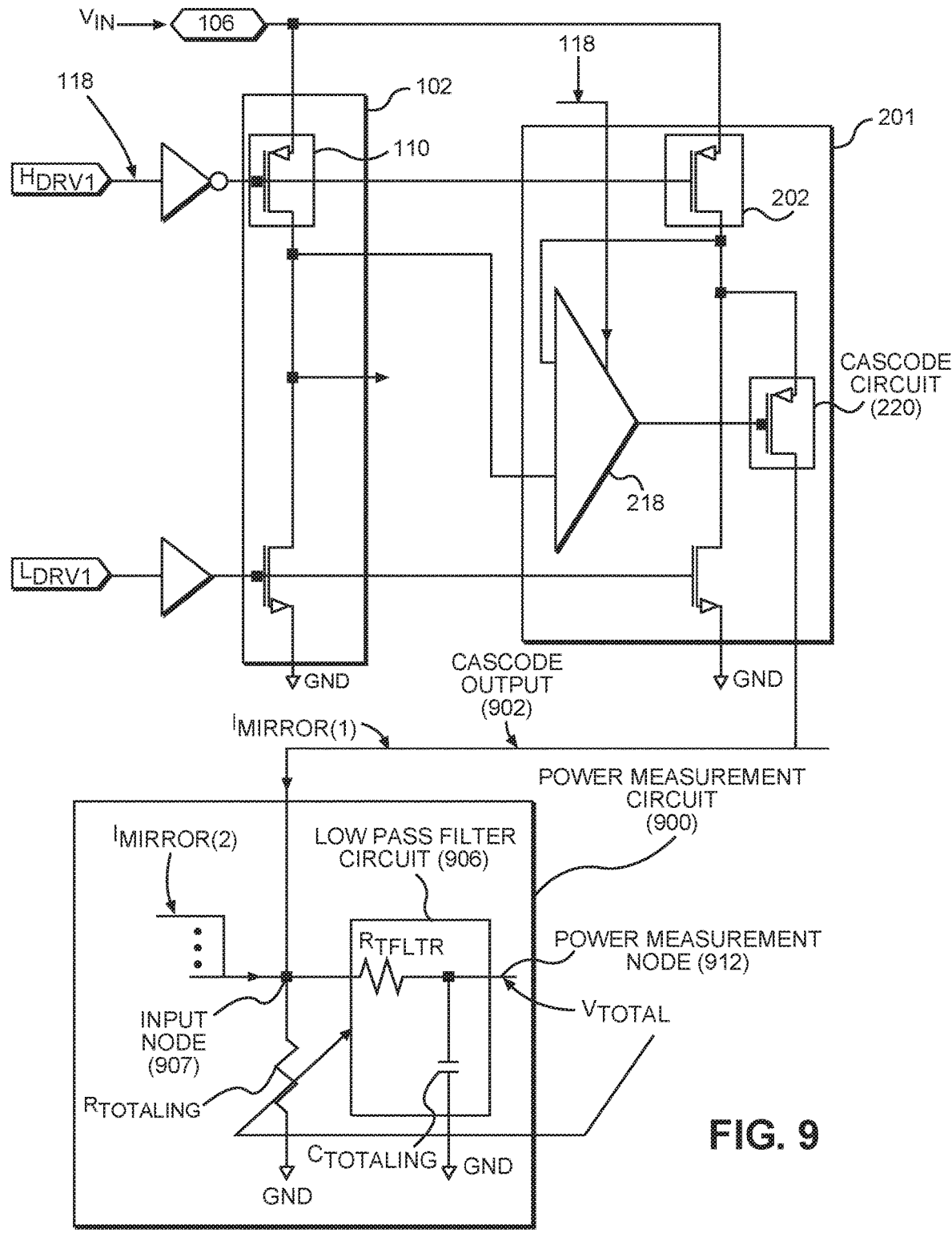
FIG. 9 is a circuit diagram of the power distribution circuit of FIG. 2 employing an exemplary voltage averaging circuit to determine an average output voltage corresponding to a total of driver currents in HSD circuits of the DC-DC converters in the power distribution circuit of FIG. 1.

FIG. 9 illustrates an exemplary power measurement circuit 900 coupled to a cascode output 902 of the cascode circuit 220 in any one of the buck converters 102(1)-102(4) of FIG. 1, for example. In contrast to FIG. 2, in which the sense resistor $R_{SENSE}$ is coupled to the cascode circuit 220 of the buck converter 102, a totaling resistor $R_{TOTALING}$ in the power measurement circuit 900 is coupled to the cascode output 902 in the buck converter 102. The power measurement circuit 900 is similar to the voltage averaging circuit 501 of FIG. 5, which includes the sense resistor $R_{SENSE}$, the switch circuit 508, and the low pass filter circuit 506. For example, the totaling resistor $R_{TOTALING}$ corresponds to the sense resistor $R_{SENSE}$, and a low pass filter circuit 906 in the example of FIG. 9 corresponds to the low pass filter circuit 506. A totaling capacitor $C_{TOTALING}$ in the low pass filter circuit 906 is coupled to a reference voltage, such as a negative supply rail or ground (GND). The totaling resistor $R_{TOTALING}$ is coupled directly to the totaling capacitor $C_{TOTALING}$.

An input node 907 of the power measurement circuit 900 is coupled to the cascode output 902 of the cascode circuit 220, and the power measurement circuit 900 receives a plurality of the mirror currents $I_{MIRROR(1)}$-$I_{MIRROR(4)}$ from the multi-phase buck DC-DC converter 104. As discussed above, the clock period in each phase is the same, but the clock periods of the respective buck converters 102(1)-102(4) are out of phase with each other, evenly shifted over the clock period. For example, the clock periods of the buck converters 102(1)-102(4) in the multi-phase buck DC-DC converter 104 may be shifted at 90°, 180°, and 270°, respectively, relative to the clock period of the buck converter 102. Unless the duty cycle of the HSD control signal 118 drops below 45% of the clock period (for a 4-phase system), at least one of the buck converters 102(1)-102(4) will be generating a non-zero mirror current $I_{MIRROR}$ during an entire clock period. The total power distributed to the multi-phase buck DC-DC converter 104 can be measured by a voltage $V_{TOTAL}$ at a power measurement node 912 coupled to the totaling capacitor $C_{TOTALING}$, as described with regard to the average voltage $V_{AVG}$ of FIG. 5.

Figure 10:
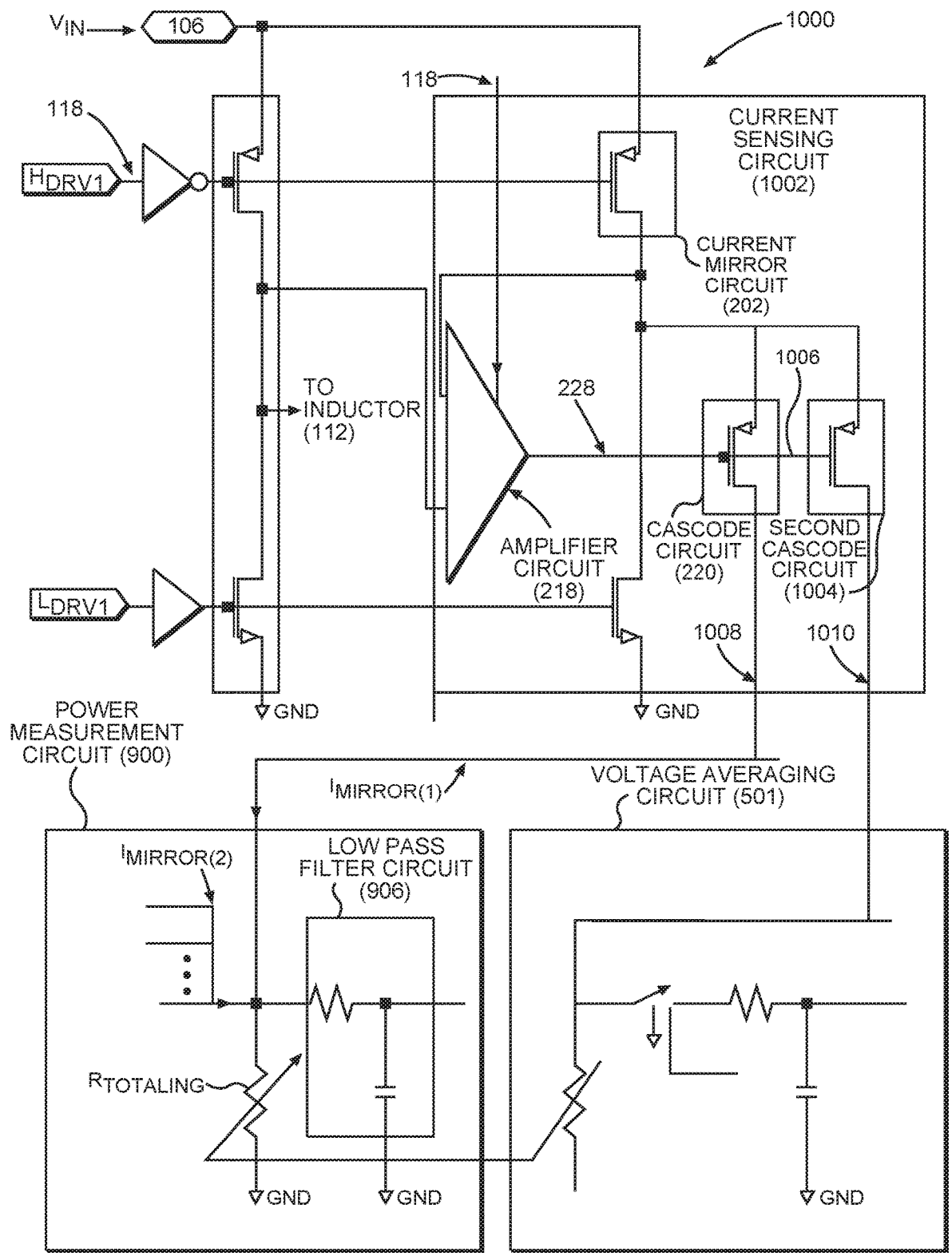
FIG. 10 is a circuit diagram of the power distribution circuit of FIG. 9, wherein a current sensing circuit includes a second cascode circuit coupled to the voltage averaging circuit.

FIG. 10 is a schematic diagram 1000 of the example of FIG. 9 additionally employing the voltage averaging circuit 501 of FIG. 5. In this example of FIG. 10, a current sensing circuit 1002 includes the current mirror circuit 202 coupled to the cascode circuit 220, which is further coupled to the power measurement circuit 900 of FIG. 9. In addition, the current mirror circuit 202 is also coupled to a second cascode circuit 1004, which includes a second cascode control node 1006 coupled to the voltage equalizing signal 228. The second cascode circuit 1004 is controlled by the voltage equalizing signal 228 in a manner identical to control of the cascode circuit 220 and functions in a manner identical to the function of the cascode circuit 220. The cascode circuit 220 and the second cascode circuit 1004 can be equally sized so the mirror current $I_{MIRROR}$ is evenly divided between them, with a first half current 1008 in the cascode circuit 220 and a second half current 1010 in the second cascode circuit 1004. As with the mirror current $I_{MIRROR}$, each of the first half current 1008 and the second half current 1010 is proportional to the driver current $I_{DRIVE}$ in the inductor 112. Although the proportional relationship in the example of FIG. 10 differs from the examples of FIG. 5 and FIG. 9, (e.g., by a factor of 2), the average driver current $I_{DRV\_AVG}$ (per-phase current) provided to the buck converter 102 and a total power provided to the multi-phase buck DC-DC converter 104 can be determined by the voltage averaging circuit 501 in FIG. 5 and the power measurement circuit 900 shown in the schematic diagram 1000 of FIG. 10.

Figure 11:
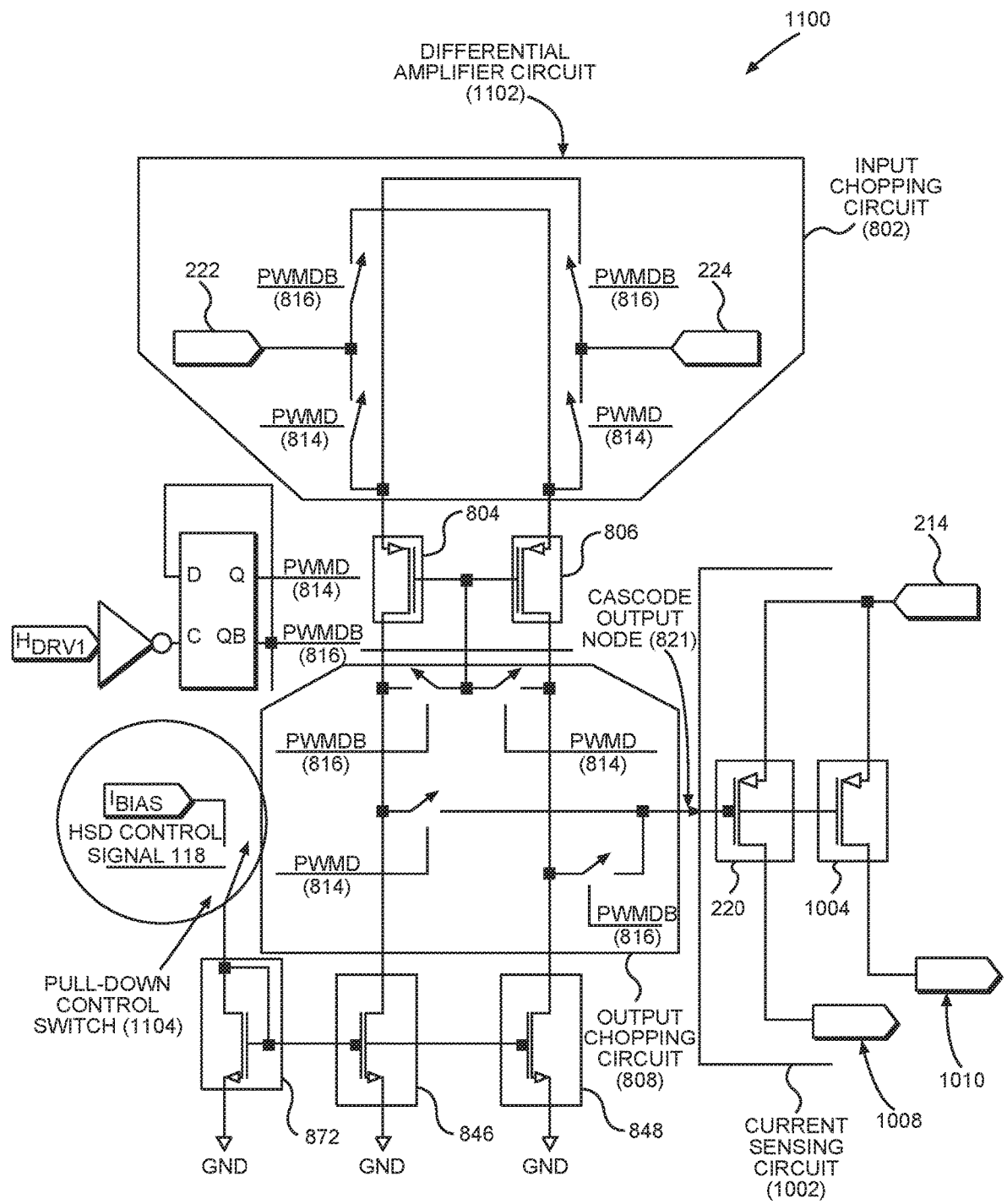
FIG. 11 is a circuit diagram of an exemplary amplifier circuit that can be employed as the differential amplifier circuit in the current sensing circuit of FIG. 8, wherein the amplifier circuit includes a switch to power down circuits in the differential amplifier circuit during a discharging stage of a clock period.

FIG. 11 is a circuit diagram 1100 of a differential amplifier circuit 1102 corresponding to the differential amplifier circuit 800 of FIG. 8 employing the second cascode circuit 1004 of FIG. 10. In addition, the differential amplifier circuit 1102 includes a pull-down control switch 1104 coupling the bias current $I_{BIAS}$ to the diode connected transistor 872 in response to the HSD control signal 118. Thus, the diode connected transistor 872 operates only when the HSD control signal 118 is asserted during the discharging stage 410. In addition, the cascode output port 821 of the differential amplifier circuit 1102 is coupled to the cascode circuit 220 and the second cascode circuit 1004, according to FIG. 10. As in FIG. 8, it should be noted that "H-$_{DRV1}$" in FIG. 11 indicates an HSD control signal 118 for the first phase of the multi-phase buck DC-DC converter 104. For differential amplifier circuits 1102 operating in the second, third, and fourth phases, for example, the corresponding HSD control signals 118 may be labeled $H_{DRV2}$, $H_{DRV3}$, and $H_{DRV4}$, respectively.

Figure 12:
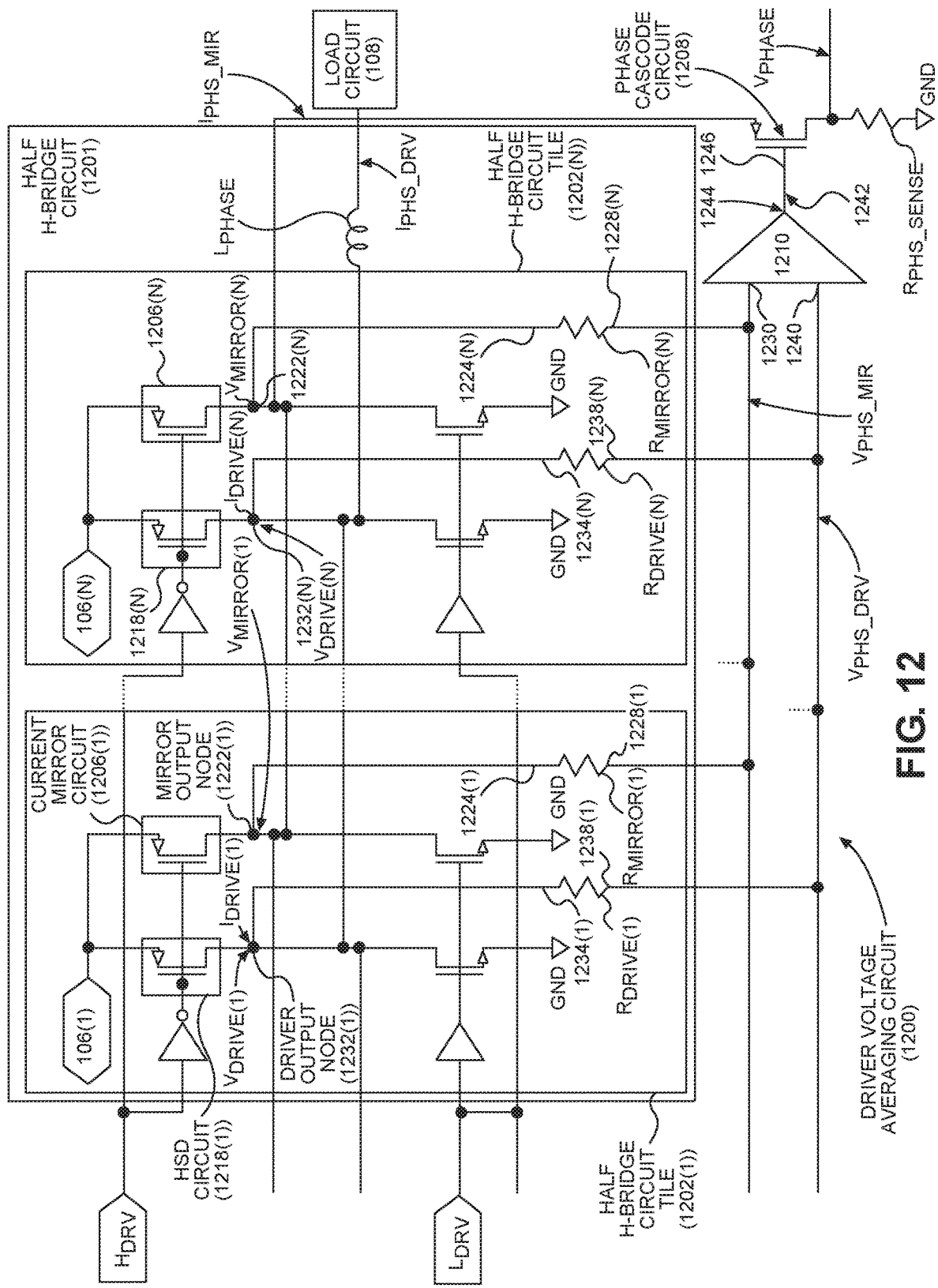
FIG. 12 is a circuit diagram of a power distribution circuit employing DC-DC converters generating current in a same phase of a multi-phase buck DC-DC converter, wherein each DC-DC converter is illustrated as a half H-bridge circuit tile with a HSD circuit coupled to a current mirror circuit, and a difference between an average of driver voltages at driver output nodes of the HSD circuit and an average of the mirror voltages at mirror output nodes of the current mirror circuit is amplified.

FIG. 12 is a schematic diagram of a driver voltage averaging circuit 1200 including a single half H-bridge circuit 1201 that may be one phase of the multi-phase buck DC-DC converter 104. The half H-bridge circuit 1201 includes a plurality of half H-bridge circuit tiles 1202(1)-1202(N). The half H-bridge circuit tiles 1202(1)-1202(N) are coupled in parallel to generate driver currents $I_{DRIVE(1)}$-$I_{DRIVE(N)}$ all in the same phase, which is in contrast to the example of FIG. 1, in which the buck converters 102(1)-102(4) each provide driver currents $I_{DRIVE(1)}$-$I_{DRIVE(4)}$ in different phases of the clock period. Similarly, in the examples of FIGS. 2, 5, 9, and 10, a single buck converter 102 provides power in one phase of the clock period, so the amplifier circuit 218, the cascode circuit 220, and the current mirror circuit 202 are dedicated to the single buck converter 102. In contrast, the driver voltage averaging circuit 1200 includes the half H-bridge circuit tiles 1202(1)-1202(N) that together generate a phase mirror current $I_{PHS\_MIR}$ in a same phase of the clock period. The phase mirror current $I_{PHS\_MIR}$ is a total current produced by all of the half H-bridge circuit tiles 1202(1)-1202(N). The half H-bridge circuit tiles 1202(1)-1202(N) in this example may be used to generate more power in the same phase than a single one of the buck converters 102(1)-102(4) is capable of generating. The half H-bridge circuit tiles 1202(1)-1202(N) may be distributed across an IC, so there are differences in wire length between an external power source and respective input power nodes. There are also differences in wire length from the respective half H-bridge circuit tiles 1202(1)-1202(N) to a location at which their total current can be measured. To measure the phase mirror current $I_{PHS\_MIR}$ despite differences in wire lengths from the respective half H-bridge circuit tiles 1202(1)-1202(N) to a measurement circuit, the driver voltage averaging circuit 1200 produces average voltages that reflect the phase mirror current $I_{PHS\_MIR}$ independent of spatial profile of the currents flowing through each of the half H-bridge circuit tiles 1202(1)-1202(N).

Although the half H-bridge circuit tiles 1202(1)-1202(N) include dedicated current mirror circuits 1206(1)-1206(N), all of the half H-bridge circuit tiles 1202(1)-1202(N) share a phase cascode circuit 1208 and a phase voltage amplifier circuit 1210. The phase voltage amplifier circuit 1210 does not amplify a difference between a mirror voltage $V_{MIRROR(1)}$ and a driver voltage $V_{DRIVE(1)}$ as in the buck converter 102. Instead, the phase voltage amplifier circuit 1210 amplifies a difference between a phase driver voltage $V_{PHS\_DRV}$ and a phase mirror voltage $V_{PHS\_MIR}$. The phase driver voltage $V_{PHS\_DRV}$ is an average of driver voltages $V_{DRIVE(1)}$-$V_{DRIVE(N)}$ in HSD circuits 1218(1)-1218(N) of the half H-bridge circuit tiles 1202(1)-1202(N), and the phase mirror voltage $V_{PHS\_MIR}$ is an average of mirror voltages $V_{MIRROR(1)}$-$V_{MIRROR(N)}$ of the current mirror circuits 1206(1)-1206(N). To generate the phase mirror voltage $V_{PHS\_MIR}$, the half H-bridge circuit tiles 1202(1)-1202(N) couple mirror output nodes 1222(1)-1222(N) of the current mirror circuits 1206(1)-1206(N) to first nodes 1224(1)-1224(N) of mirror resistors $R_{MIRROR(1)}$-$R_{MIRROR(N)}$, and couple second nodes 1228(1)-1228(N) of the mirror resistors $R_{MIRROR(1)}$-$R_{MIRROR(N)}$ to a first node 1230 of the phase voltage amplifier circuit 1210. The mirror output nodes 1222(1)-1222(N) being coupled to each other through the mirror resistors $R_{MIRROR(1)}$-$R_{MIRROR(N)}$ produce the phase mirror voltage $V_{PHS\_MIR}$. To generate an average of the driver voltages $V_{DRIVE(1)}$-$V_{DRIVE(N)}$, the half H-bridge circuit tiles 1202(1)-1202(N) couple driver output nodes 1232(1)-1232(N) of the HSD circuits 1218(1)-1218(N) to first nodes 1234(1)-1234(N) of driver resistors $R_{DRIVE(1)}$-$R_{DRIVE(N)}$, and couple all second nodes 1238(1)-1238(N) of the driver resistors $R_{DRIVE(1)}$-$R_{DRIVE(N)}$ to a second input node 1240 of the phase voltage amplifier circuit 1210. The driver output nodes 1232(1)-1232(N) being coupled to each other through the driver resistors $R_{DRIVE(1)}$-$R_{DRIVE(N)}$ produce the phase driver voltage $V_{PHS\_DRV}$.

As noted above, the phase voltage amplifier circuit 1210 amplifies the difference between the phase driver voltage $V_{PHS\_DRV}$ and the phase mirror voltage $V_{PHS\_MIR}$. A phase amplifier equalizing signal 1242 is generated on an output port 1244 of the phase voltage amplifier circuit 1210, and the output port 1244 is coupled to a cascode control node 1246 of the phase cascode circuit 1208. The phase cascode circuit 1208 is coupled to the mirror output nodes 1222(1)-1222(N) to receive the phase mirror current $I_{PHS\_MIR}$ and is also coupled to a phase sense resistor $R_{PHS\_SENSE}$. The phase mirror current $I_{PHS\_MIR}$ generates a phase voltage $V_{PHASE}$ across the phase sense resistor $R_{PHS\_SENSE}$. The phase voltage $V_{PHASE}$ is proportional to the phase mirror current $I_{PHS\_MIR}$ and is also proportional to a phase driver current $I_{PHS\_DRV}$ in a phase inductor $L_{PHASE}$. The phase driver current $I_{PHS\_DRV}$ is a total current output to the load circuit 108 of FIG. 1 from the driver voltage averaging circuit 1200 in a phase of a clock period.

Further, the circuits and elements described herein are sometimes referred to as means for performing particular functions. In this regard, a current sensing circuit in a DC-DC converter comprises a means for generating a mirror current based on a driver current in a HSD circuit, in response to a HSD control signal. Examples of the means for generating the mirror current based on the driver current in the HSD circuit, in response to the HSD control signal include the current mirror circuit 202 in FIGS. 2, 5, 9, and 10 and the current mirror circuits 1206(1)-1206(N) in FIG. 12. The current sensing circuit further comprises a means for amplifying a difference between a driver voltage at an output node of the HSD circuit and a mirror voltage at an output node of the means for generating the mirror current. Examples of the means for amplifying the difference between the driver voltage at the output node of the HSD circuit and the mirror voltage at the output node of the means for generating the mirror current include the amplifier circuit 218 in FIGS. 2, 5, 9, and 10. The current sensing circuit further comprises a means for generating a voltage equalizing signal on an output port of the means for amplifying, the voltage equalizing signal representing the amplified difference between the mirror voltage and the driver voltage. Examples of the means for generating the voltage equalizing signal on the output port of the means for amplifying, the voltage equalizing signal representing the amplified difference between the mirror voltage and the driver voltage, include the amplifier circuit 218 in FIGS. 2, 5, 9, and 10. The current sensing circuit further comprises a means for adjusting the mirror voltage on the output node of the means for generating the mirror current to correspond to the driver voltage, in response to the voltage equalizing signal. Examples of the means for adjusting the mirror voltage on the output node of the means for generating the mirror current to correspond to the driver voltage, in response to the voltage equalizing signal, include the cascode circuit 220 in FIGS. 2, 5, 9, and 10 and the second cascode circuit 1004 in FIG. 10.

A power distribution circuit that includes a DC-DC converter and a current sensing circuit, wherein the DC-DC converter employs a HSD circuit and a LSD circuit, and the current sensing circuit is configured to generate a mirror current to generate a sense voltage that can be sensed to sense the driver current supplied to a load circuit by the HSD circuit, including, but not limited to, the current sensing circuits 201 in FIGS. 2, 5, 9, and 10, and according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
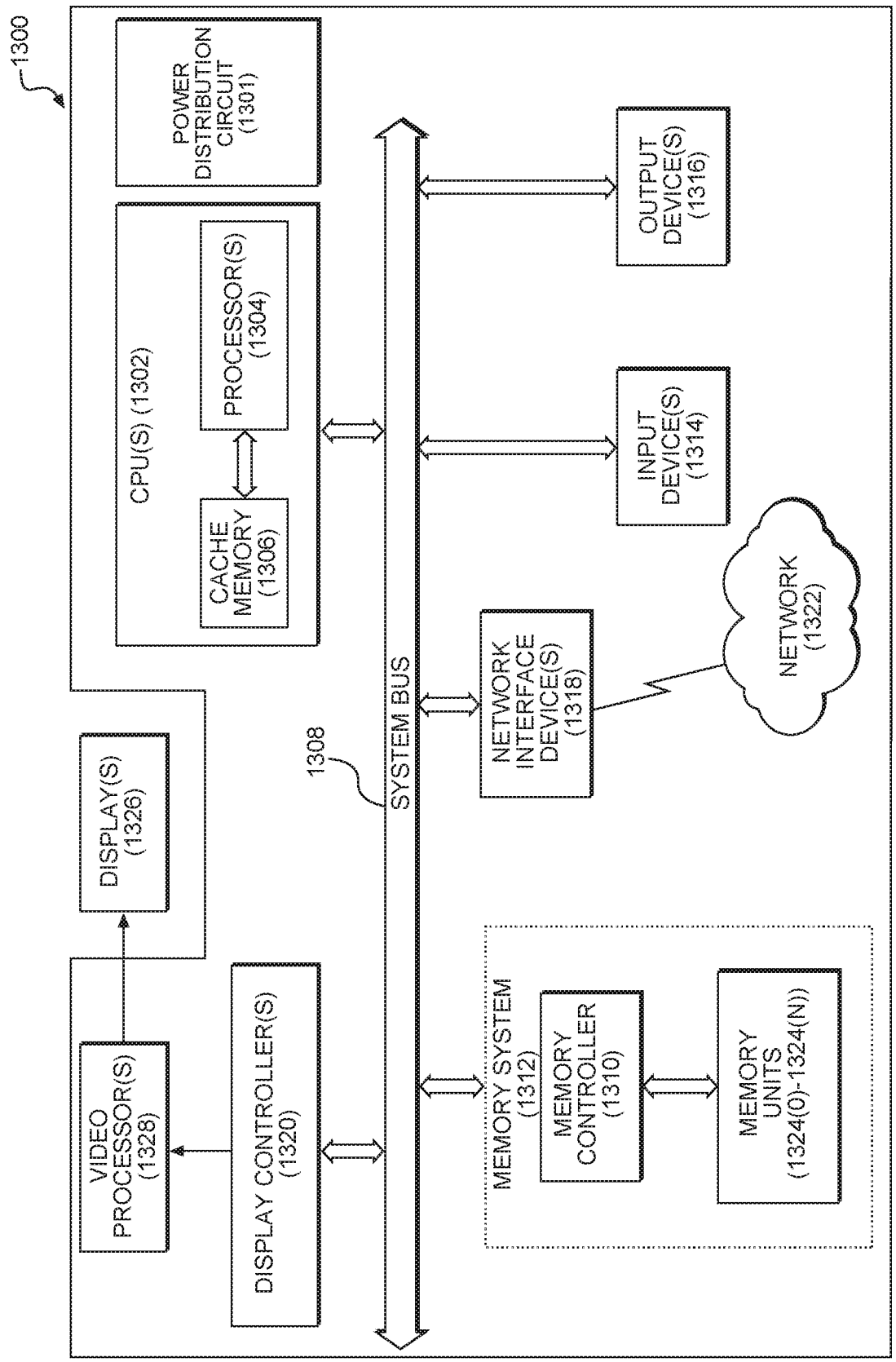
FIG. 13 is a block diagram of an exemplary processor-based system that can include a power distribution circuit that includes a DC-DC converter and a current sensing circuit, wherein the DC-DC converter employs a HSD circuit and a LSD circuit, and the current sensing circuit is configured to generate a mirror current to generate a sense voltage that can be sensed to sense a driver current supplied to a load circuit by the HSD circuit, including, but not limited to, the current sensing circuits in FIGS. 2, 5, 9, and 10.

In this regard, FIG. 13 illustrates an example of a processor-based system 1300 that can employ a power distribution circuit 1301 that includes a DC-DC converter and a current sensing circuit, wherein the DC-DC converter employs a HSD circuit and a LSD circuit, and the current sensing circuit is configured to generate a mirror current to generate a sense voltage that can be sensed to sense the driver current supplied to a load circuit by the HSD circuit, including, but not limited to, the current sensing circuits 201 in FIGS. 2, 5, 9, and 10. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated of FIG. 13, multiple system buses 1308 could be provided, wherein each system bus 1308 constitutes a different fabric.

Other master and slave devices can be connected to the system bus 1308. As illustrated of FIG. 13, these devices can include a memory system 1312, one or more input devices 1314, one or more output devices 1316, one or more network interface devices 1318, and one or more display controllers 1320, as examples. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any devices configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0)-1324(N).

The CPU(s) 1302 may also be configured to access the display controller(s) 1320 over the system bus 1308 to control information sent to one or more displays 1326. The display controller(s) 1320 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc.

Figure 14:
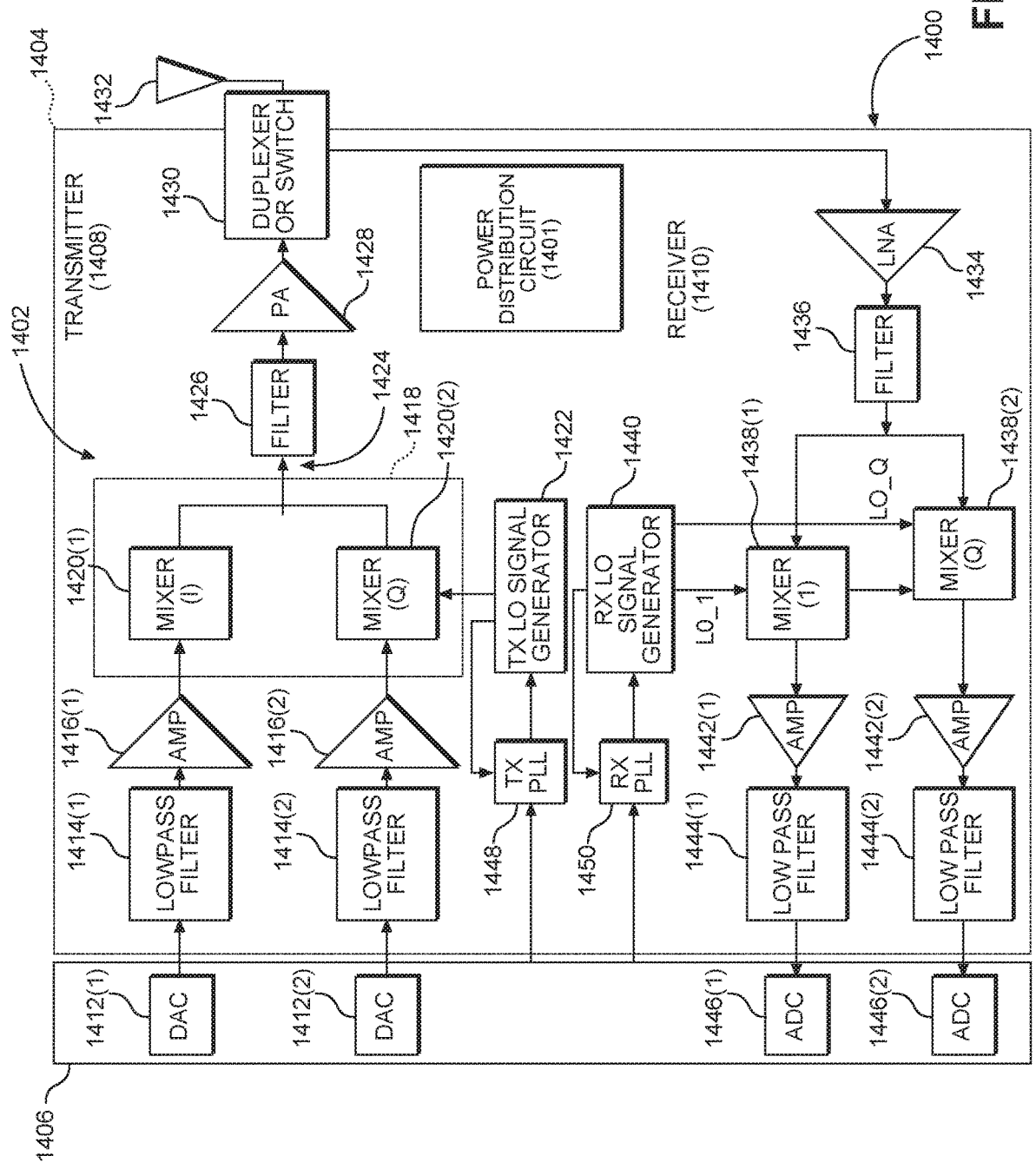
FIG. 14 is a block diagram of an exemplary wireless communications device that includes radio frequency (RF) components formed in an integrated circuit (IC), wherein the wireless communications device can include a power distribution circuit that includes a DC-DC converter and a current sensing circuit, wherein the DC-DC converter employs a HSD circuit and a LSD circuit, and the current sensing circuit is configured to generate a mirror current to generate a sense voltage that can be sensed to sense a driver current supplied to a load circuit by the HSD circuit, including, but not limited to, the current sensing circuits in FIGS. 2, 5, 9, and 10.

FIG. 14 illustrates an exemplary wireless communications device 1400 that includes radio frequency (RF) components formed in an IC 1402, wherein the IC 1402 can include a power distribution circuit 1401 that includes a DC-DC converter and a current sensing circuit, wherein the DC-DC converter employs a HSD circuit and a LSD circuit, and the current sensing circuit is configured to generate a mirror current to generate a sense voltage that can be sensed to sense the driver current supplied to a load circuit by the HSD circuit, including, but not limited to, the current sensing circuits 201 in FIGS. 2, 5, 9, and 10. In this regard, the wireless communications device 1400 may be provided in the IC 1402. The wireless communications device 1400 may include or be provided in any of the above-referenced devices, as examples. As shown of FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RF ICs (RFICs), mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 of FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes DACs 1412(1) and 1412(2) for converting digital signals generated by the data processor 1406 into the I and Q analog output signals, e.g., I and Q output currents, for further processing.

Within the transmitter 1408, low pass filters 1414(1) and 1414(2) filter the I and Q analog output signals, respectively, to remove undesired signals caused by the prior digital-to-analog conversion Amplifiers (AMPs) 1416(1) and 1416(2) amplify the signals from the low pass filters 1414(1) and 1414(2), respectively, and provide I and Q baseband signals. An upconverter 1418 upconverts the I and Q baseband signals with I and Q transmit (TX) local oscillator (LO) signals through mixers 1420(1) and 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired delivered power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Downconversion mixers 1438(1) and 1438(2) mix the output of the filter 1436 with I and Q RX LO signals (i.e., LO_I and LO_Q) from an RX LO signal generator 1440 to generate I and Q baseband signals. The I and Q baseband signals are amplified by amplifiers (AMPs) 1442(1) and 1442(2) and further filtered by low pass filters 1444(1) and 1444(2) to obtain I and Q analog input signals, which are provided to the data processor 1406. In this example, the data processor 1406 includes analog-to-digital converters (ADCs) 1446(1) and 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The arbiters, master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A current sensing circuit, comprising: a current mirror circuit, comprising:
    a power supply node coupled to an input power node; and
    a control node configured to be coupled to a high side driver (HSD) circuit of a direct current-direct current (DC-DC) converter to receive a HSD control signal;
    an amplifier circuit, comprising:
    a first input port coupled to the current mirror circuit; and
        a second input port configured to be coupled to an output node of the HSD circuit; and
    a cascode circuit coupled to the current mirror circuit and the amplifier circuit, the cascode circuit comprising:
        an output port coupled to a sensing node; and a cascode control port coupled to the amplifier circuit wherein the amplifier circuit comprises a differential amplifier circuit, wherein the differential amplifier circuit comprises:

an input chopping circuit comprising a first input node and a second input node; an output chopping circuit comprising an input node, a complement input node, an output node, a complement output node, and a cascode output node coupled to the cascode circuit;

a pull-up circuit coupled between the input chopping circuit and the input node of the output chopping circuit;

a complement pull-up circuit coupled between the input chopping circuit and the complement input node of the output chopping circuit; a pull-down circuit coupled between a negative supply rail and the output node of the output chopping circuit; and a complement pull-down circuit coupled between the negative supply rail and the complement output node of the output chopping circuit; the input chopping circuit configured to:

couple a first input node of the differential amplifier circuit to the pull-up circuit and couple a second input node of the differential amplifier circuit to the complement pull-up circuit in response to a chopping control signal based on the HSD control signal; and couple the first input node of the differential amplifier circuit to the complement pull-up circuit and couple the second input node of the differential amplifier circuit to the pull-up circuit in response to a complement chopping control signal based on a complement of the HSD control signal; and the output chopping circuit configured to:

couple the pull-up circuit to the cascode output node in response to the chopping control signal; and couple the complement pull-up circuit to the cascode output node in response to the complement chopping control signal.

2. The current sensing circuit of claim 1, wherein:
the current mirror circuit further comprises an output node;
the amplifier circuit further comprises an output port, and the first input port of the amplifier circuit is coupled to the output node of the current mirror circuit; and
the cascode circuit further comprises an input port coupled to the output node of the current mirror circuit.

3. The current sensing circuit of claim 2, wherein:
the current mirror circuit is configured to generate a mirror current based on a driver current in the HSD circuit, in response to the HSD control signal;
the amplifier circuit is configured to amplify a difference between a driver voltage at the output node of the HSD circuit and a mirror voltage at the output node of the current mirror circuit, and output a voltage equalizing signal on the output port of the amplifier circuit representing the amplified difference between the mirror voltage and the driver voltage; and
the cascode circuit is configured to adjust the mirror voltage at the output node of the current mirror circuit corresponding to the driver voltage, in response to the voltage equalizing signal.

4. The current sensing circuit of claim 3, wherein the current mirror circuit is configured to generate the mirror current proportional to the driver current in the HSD circuit, in response to the HSD control signal.

5. The current sensing circuit of claim 1, wherein the current mirror circuit comprises a transistor comprising a gate control node coupled to the control node, a first node coupled to the power supply node, and a second node coupled to the first input port of the amplifier circuit.

6. The current sensing circuit of claim 1, wherein the current mirror circuit has a resistance proportional to a resistance of the HSD circuit.

7. The current sensing circuit of claim 1, wherein:
a first input node of the differential amplifier circuit comprises an inverting input port of the differential amplifier circuit; and
a second input node of the differential amplifier circuit comprises a non-inverting port of the differential amplifier circuit.

8. The current sensing circuit of claim 1, wherein:
a first input node of the differential amplifier circuit comprises a non-inverting input port of the differential amplifier circuit;
and a second input node of the differential amplifier circuit comprises an inverting port of the differential amplifier circuit.

9. The current sensing circuit of claim 1, wherein:
the pull-up circuit comprises a pull-up transistor, the pull-up transistor comprising an input node coupled to an output node of the input chopping circuit, an output node coupled to the input node of the output chopping circuit, and a pull-up gate control node;
the complement pull-up circuit comprises a complement pull-up transistor, the complement pull-up transistor comprising an input node coupled to a complement output node of the input chopping circuit, an output node coupled to the complement input node of the output chopping circuit, and a complement pull-up gate control node;
the pull-down circuit comprises a pull-down transistor comprising an input node coupled to the output node of the output chopping circuit, an output node coupled to the negative supply rail, and a pull-down gate control node; and
the complement pull-down circuit comprises a complement pull-down transistor, the complement pull-down transistor comprising an input node coupled to the complement output node of the output chopping circuit, an output node coupled to the negative supply rail, and a complement pull-down gate control node.

10. The current sensing circuit of claim 1, wherein the input chopping circuit comprises:
a first input switch configured to couple the first input node of the differential amplifier circuit to the pull-up circuit and a complement second input switch to couple the second input node of the differential amplifier circuit to the complement pull-up circuit, in response to the chopping control signal based on the HSD control signal; and
a complement first input switch to couple the first input node of the differential amplifier circuit to the complement pull-up circuit and a second input switch to couple the second input node of the differential amplifier circuit to the pull-up circuit, in response to the complement chopping control signal based on the complement of the HSD control signal.

11. The current sensing circuit of claim 9, wherein the output chopping circuit further comprises:
an output switch comprising a first node coupled to the input node of the output chopping circuit and the output node of the output chopping circuit, and a second node coupled to the cascode output node of the output chopping circuit;
a complement output switch comprising a first node coupled to the complement input node of the output chopping circuit and the complement output node of the output chopping circuit, and a second node coupled to the cascode output node of the output chopping circuit;
a bias switch comprising a first node coupled to the output node of the pull-up circuit, and a second node coupled to the pull-up gate control node and the complement pull-up gate control node; and
a complement bias switch comprising a first node coupled to the output node of the complement pull-up circuit, and a second node coupled to the pull-up gate control node and the complement pull-up gate control node.

12. The current sensing circuit of claim 9, wherein the differential amplifier circuit is further configured to couple a bias voltage based on the HSD control signal to the pull-down gate control node of the pull-down transistor and the complement pull-down gate control node of the complement pull-down transistor.

13. The current sensing circuit of claim 1, wherein the cascode circuit comprises a cascode transistor comprising a gate control node coupled to the amplifier circuit, an input node coupled to the current mirror circuit, and the output port coupled to the sensing node.

14. The current sensing circuit of claim 3, wherein the cascode circuit is configured to adjust coupling between the output node of the current mirror circuit and the sensing node in response to the voltage equalizing signal on the output port of the amplifier circuit representing the amplified difference between the mirror voltage and the driver voltage.

15. The current sensing circuit of claim 3, wherein the cascode circuit is configured to:
cause the mirror voltage at the output node of the current mirror circuit to increase in response to the voltage equalizing signal on the output port of the amplifier circuit indicating that the mirror voltage is less than the driver voltage; and
cause the mirror voltage at the output node of the current mirror circuit to decrease in response to the voltage equalizing signal on the output port of the amplifier circuit indicating that the mirror voltage is greater than the driver voltage.

16. The current sensing circuit of claim 13, wherein the cascode transistor is configured to adjust a resistance of the cascode transistor based on a voltage equalizing signal connected to the gate control node of the cascode transistor.

17. The current sensing circuit of claim 1, further comprising a voltage averaging circuit, comprising:
a sense resistor coupled to the sensing node and a negative supply rail; and
a switch circuit coupled to the sensing node and a low pass filter circuit, wherein the low pass filter circuit comprises a filter resistor and an averaging capacitor coupled to the sensing node.

18. The current sensing circuit of claim 17, wherein the switch circuit is configured to couple the sensing node to an output node of the voltage averaging circuit, in response to the HSD control signal, to induce a voltage on the sensing node having an amplitude based on a mirror current of the current mirror circuit.

19. The current sensing circuit of claim 18, further comprising an over-current detection circuit coupled to the output node of the voltage averaging circuit, the over-current detection circuit comprising an over-current comparator configured to compare a voltage level at the sensing node to a threshold voltage, and output an over-current indication based on a pulse-width modulated (PWM) reset enable signal.

20. The current sensing circuit of claim 19, wherein the over-current detection circuit further comprises a digital-to-analog converter (DAC) configured to output the threshold voltage, in response to receiving digital threshold voltage information.

21. The current sensing circuit of claim 1, further comprising:
a power measurement circuit coupled to the sensing node and a power measurement node,
the power measurement circuit comprising a sense resistor and a low pass filter.

22. The current sensing circuit of claim 21, wherein the low pass filter comprises:
a filter resistor coupled to the sensing node and the power measurement node; and
a capacitor coupled to the power measurement node and a reference voltage.

23. The current sensing circuit of claim 22, wherein the power measurement circuit is configured to receive a plurality of mirror currents from a plurality of cascode circuits, and induce a voltage at the power measurement node representing a total of a mirror current of the current sensing circuit and a second mirror current of a second current sensing circuit.

24. The current sensing circuit of claim 21, further comprising:
a second cascode circuit comprising an output port coupled to the sensing node, a second cascode control port coupled to the amplifier circuit, and an input port coupled to an output node of the current mirror circuit.

25. The current sensing circuit of claim 24, wherein a mirror current in the current mirror circuit is divided between the cascode circuit and the second cascode circuit, and a voltage on the power measurement node reflects the mirror current in the current mirror circuit and a second mirror current in the current mirror circuit of the current sensing circuit.

26. The current sensing circuit of claim 1 integrated into an integrated circuit (IC).

27. The current sensing circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

* * * * *